United States Patent [19]

Long et al.

[11] Patent Number: 5,041,800

[45] Date of Patent: Aug. 20, 1991

[54] LOWER POWER OSCILLATOR WITH HEATED RESONATOR (S), WITH DUAL MODE OR OTHER TEMPERATURE SENSING, POSSIBLY WITH AN INSULATIVE SUPPORT STRUCTURE DISPOSED BETWEEN THE RESONATOR (S) AND A RESONATOR ENCLOSURE

[75] Inventors: Bruce R. Long; Leslie C. Hurley; William P. Hanson, all of Carlisle, Pa.

[73] Assignee: PPA Industries, Inc., Dallas, Tex.

[21] Appl. No.: 630,897

[22] Filed: Dec. 20, 1990

Related U.S. Application Data

[63] Continuation-in-part of Ser. No. 485,565, Feb. 27, 1990, Pat. No. 4,985,687, and a continuation-in-part of Ser. No. 363,595, May 19, 1989, Pat. No. 5,004,987.

[51] Int. Cl.[5] .................................................. H03B 5/32
[52] U.S. Cl. .................................... 331/69; 331/158; 310/315; 310/344
[58] Field of Search .................. 331/18, 34, 69, 70, 331/158, 176; 310/315, 341, 342, 343, 344

[56] References Cited

U.S. PATENT DOCUMENTS

| | | | |
|---|---|---|---|
| 3,322,981 | 5/1967 | Brenig | 310/8.9 |
| 3,414,794 | 12/1968 | Wood | 310/8.5 |
| 3,431,392 | 3/1969 | Garland et al. | 219/210 |
| 3,463,945 | 8/1969 | Fewings | 310/8.5 |
| 3,553,602 | 1/1971 | Brothers et al. | 331/40 |
| 3,561,832 | 2/1971 | Karrer et al. | 310/9.6 |
| 3,715,563 | 2/1973 | Bloch | 219/210 |
| 3,826,931 | 7/1974 | Hammond | 310/8.1 |
| 3,882,332 | 5/1975 | Frymoyer | 310/8.1 |
| 3,967,143 | 6/1976 | Watanabe et al. | 310/8.1 |
| 4,039,969 | 8/1977 | Martin | 331/40 |
| 4,079,280 | 3/1978 | Kusters et al. | 310/318 |
| 4,160,183 | 7/1979 | Kusters et al. | 310/315 |
| 4,215,308 | 7/1980 | Kusters | 324/78 D |
| 4,345,221 | 6/1982 | Zumsteg | 331/176 |
| 4,468,634 | 8/1984 | Takagi et al. | 331/60 |
| 4,489,289 | 12/1984 | Slobodnik et al. | 331/107 |
| 4,537,515 | 8/1985 | Dinger et al. | 368/202 |
| 4,701,661 | 10/1987 | Warner et al. | 310/360 |
| 4,748,367 | 5/1988 | Bloch et al. | 310/343 |
| 4,839,613 | 6/1989 | Echols et al. | 331/69 |
| 4,872,765 | 10/1989 | Schodowski | 374/117 |

OTHER PUBLICATIONS

Kusters, et al., "Dual Mode Operation of Temperature and Stress Compensated Crystals," Hewlett–Packard, pp. 389–397.
Miguel, "A Temperature Compensated SC Cut Quartz Crystal Oscillator," 1982, 36th Annual Frequency Control Symposium, pp. 576–585.
Holland, "Nonuniformly Heated Aniosotropic Plates: II. Frequency Transients in AT and BT Quartz Plates," 1974, Ultrasonics Symposium Proceedings, IEEE Cat. #74 CHO 896-1SU, pp. 592–598.
EerNisse, "Quartz Resonator Frequency Shifts Arising from Electric Stress," pp. 1–4.
Long, "Quartz Crystals and Oscillators," 1989, presented at the RF Expo '89 Santa Clara, Calif. Feb. 14–16, 1989, Sandia Laboratories, pp. 1–12.
Motorola Technical Data Sheet, "CMOS/NMOS Special Functions Data," 1986, pp. 6-63 to 6-83 (MC145151-1, MC145152-1).

Primary Examiner—David Mis
Attorney, Agent, or Firm—Mason, Fenwick & Lawrence

[57] ABSTRACT

A resonator heating element is attached to the surface of a crystal resonator. Resonator temperature sensing may be accomplished either by a sensor attached to the crystal enclosure, or through dual mode temperature sensing, or by both. A control system converts the sensed temperature into a series of variable-width pulses applied to the resonator heating element. Thus, the temperature sensing mechanism(s), control system and heating element comprise a temperature feedback control system which allows the crystal to stably operate at or very near its desired temperature. In an especially preferred embodiment, an integrated circuit from a switching power supply may be used in a novel manner to perform certain of the functions in the temperature feedback control loop. Plural resonators may be present in the enclosure, one of which may be directly involved in temperature sensing. In other embodiments, a ring-shaped insulative structure may additionally be disposed between the resonator and its enclosure.

30 Claims, 10 Drawing Sheets

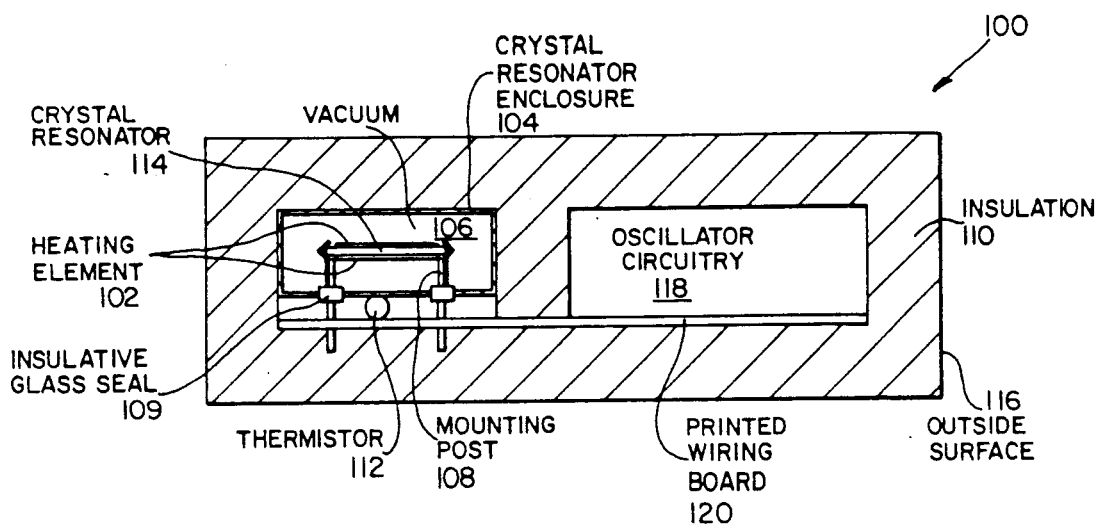
FIG. IA
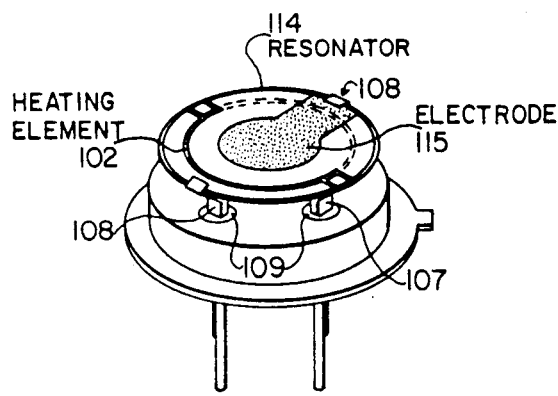
FIG. IB
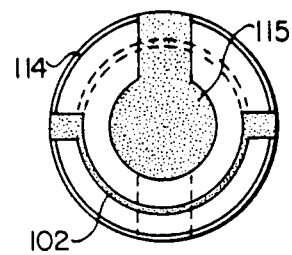
FIG. IC
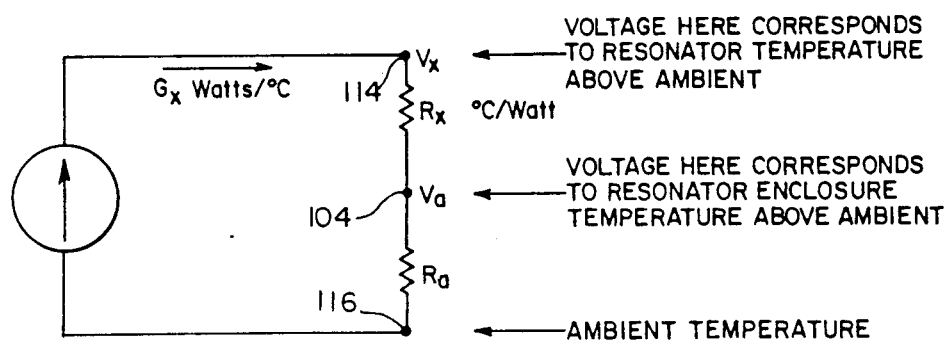
FIG. 2    THERMAL MODEL

LOWER POWER OSCILLATOR WITH HEATED RESONATOR (S), WITH DUAL MODE OR OTHER TEMPERATURE SENSING, POSSIBLY WITH AN INSULATIVE SUPPORT STRUCTURE DISPOSED BETWEEN THE RESONATOR (S) AND A RESONATOR ENCLOSURE

CROSS-REFERENCE TO RELATED APPLICATIONS

This application is a continuation-in-part of allowed U.S. patent application Ser. No. 07/485,565, filed Feb. 27, 1990, now U.S. Pat. No. 4,985,687, issued Jan. 15, 1991. This application is also a continuation-in-part of allowed U.S. patent application Ser. No. 07/363,595, filed May 19, 1989, now U.S. Pat. No. 5,004,987, issued Apr. 2, 1991. Both documents are incorporated herein by reference as if reproduced in full below.

BACKGROUND AND SUMMARY OF THE INVENTION

The present invention relates to oscillators. More specifically, it relates to improvements in crystal oscillators in which high frequency stability must be achieved while consuming a minimum amount of power.

In many applications, the frequency of a quartz crystal oscillator must remain stable despite changing ambient temperatures. For example, in a positioning system using beacons on a target, and using satellites to track the target, the positioning function is implemented using an analysis of the Doppler shift caused by the relative motion of the satellite and target. A crystal oscillator in the target transmitter must have a stable frequency output, because any change in the frequency could cause the positioning system to interpret the frequency change as a Doppler shift, resulting in a positioning error. The stabilization of a crystal oscillator's frequency in the presence of changing temperatures, with the added demand that minimum power be consumed in a battery-powered unit, presents a challenge to the designer of the crystal oscillator.

One known solution is to temperature-compensate the oscillator. A voltage variable capacitor is added to the oscillator so that the frequency can be shifted a small amount by a correction voltage developed by a thermistor network. This correction voltage causes the oscillator frequency to remain substantially constant as the ambient temperature changes. Because perfect cancellation is not possible, there remains some residual frequency drift as a function of temperature. Additionally, the frequency correction network degrades the oscillator's phase noise characteristics and short term stability.

Another known solution is to maintain the entire oscillator including the quartz resonator at a precisely controlled elevated temperature, higher than the greatest expected ambient temperature. The oscillator temperature is regulated by a thermostat or proportional controller. Excellent frequency stability is possible if a sufficiently accurate temperature feedback loop is employed. A temperature-regulated oscillator has far better frequency stability than the temperature-compensated oscillator described in the previous paragraph, and suffers no phase noise degradation. However, for many battery-powered applications, the heater's electrical power requirement is impractically high.

It is therefore desirable to provide a low-power temperature-controlled quartz crystal oscillator intended for battery-powered applications.

Within the confines of standard practice, electrical heating power may be reduced in two ways. First, the thermal insulation surrounding the oscillator can be increased or improved. Second, the "set temperature" (the temperature to which the oscillator components are heated and maintained) can be lowered.

Unfortunately, only minor improvements are possible with either of these known approaches.

First, insulation volume cannot be increased without increasing the overall size of the oscillator. This increase in size is generally not desirable or possible. Also, common insulation materials do not lend themselves to further development.

Second, lowering the set temperature introduces difficulties originating in the frequency-temperature characteristics of the quartz crystal resonator.

FIGS. 13A and 13B show two representative examples of known crystal resonators. In both cases the large circular body 114 is the quartz crystal resonator. Known crystal resonators generally consist of a slice of crystalline quartz, usually circular, with metallic electrodes deposited on each side. The illustrated resonator 114 has one circular electrode 115 deposited on each side of the resonator. Each electrode has a rectangular extension protruding to the edge of the resonator.

Two posts 108 provide mechanical support and electrical connection to the electrodes. These posts are electrically isolated from the resonator enclosure by glass seals 109.

The frequency-temperature characteristics of quartz crystal resonators are determined by the orientation of the quartz slice with respect to the natural axis of the crystal from which it is cut. The frequency-temperature coefficient can be made zero at a specific temperature by properly orienting the quartz slice. However, the temperature coefficient increases rapidly as the resonator temperature moves away from this optimum temperature. Temperature-controlled oscillators take advantage of the zero coefficient point to minimize the effects of ambient temperature variations. This means that the set point of the oscillator and the zero coefficient point of the resonator must be made to coincide. Accordingly, a group of quartz crystal resonators (specifically the AT-, IT- and SC-cut resonators) have been developed with a range of zero temperature coefficients occurring above the normally expected range of ambient temperatures, typically 75° C. to 85° C.

Although the zero-coefficient temperature can be varied by slight changes in crystal orientation, the extent of this variation is limited. This limited variability of zero-coefficient temperature limits the set temperature of conventional temperature controlled oscillators.

Temperature regulation of a conventional temperature-controlled oscillator is lost if the ambient temperature rises above the set temperature. The heater shuts down, and the oscillator follows the resonator's frequency-temperature curve. With traditional AT-, IT- or SC-cut resonators, frequency accuracy degrades rapidly. Loss of temperature regulation and limited control of the resonator zero-coefficient temperature place a practical lower limit on the set temperature.

As described in greater detail below, an alternative crystal cut, the FC-cut, is used by a first embodiment of the present invention to overcome these limitations. First, the inventive crystal oscillator takes advantage of the realization that the zero temperature coefficient point can be set much lower than that of traditional AT-, IT- or SC-cut resonators. Second, with proper orientation, the zero-coefficient range can be made very broad. Specifically, an FC-cut crystal resonator of proper orientation possesses the frequency-temperature relationship shown in FIG. 6. At low temperatures, the frequency-temperature coefficient is unacceptably large and positive (shown in segment 602). Segment 602 is followed by a broad segment 604 in which the frequency-temperature curve is substantially flat. At high temperatures (illustrated as segment 606), the frequency-temperature coefficient again becomes unacceptably large.

With an FC-cut resonator such as that used in the first embodiment of the present invention, the oven set temperature can be placed on the lowest point in the substantially flat region 604. As the ambient temperature rises above the set temperature, the oscillator heater shuts down. Temperature regulation is lost, but unlike conventional temperature-controlled oscillators using AT-, IT- or SC-cut resonators, frequency stability remains acceptable. Therefore, the power savings of a low set point is realized without degrading frequency accuracy at high ambient temperatures.

As recognized in parent patent application Ser. No. 07/485,565, it is also envisioned that resonator cuts other than the FC cut may be employed as a variation of the above-described embodiment. Specifically, such cuts as the SC, IT, AT, and BT cuts may be employed. For an explanation of various resonator cuts, see, for example, Long, *Quartz Crystals and Oscillators*, (Piezo Crystal Company, 100 K Street, P.O. Box 619, Carlisle, Pa. 17013; February, 1989), which is incorporated herein by reference.

Use of the SC-cut, for example, necessitates increasing the set temperature to approximately 75°–85° C. to enter a range of substantially zero temperature coefficient (compared to approximately 30° C. for the FC cut). Although this higher set temperature demands increased power consumption, the advantageous properties of SC-cut resonators (such as frequency-temperature stability, phase noise and aging) may outweigh power consumption disadvantages in many applications. In certain scenarios, therefore, use of SC-cut resonators may actually be preferable to use of FC-cut resonators.

It is also possible to reduce heat loss (and thereby reduce energy consumption) by reducing the volume of the heated enclosure. In known practice, both the crystal resonator and the oscillator circuitry are contained within a common temperature-controlled enclosure. The oscillator is elevated to nearly the same temperature as the resonator by means of the heated air contained within the enclosure. The large volume conventionally needed to enclose oscillator circuitry increases the quantity of electrical power required to maintain the elevated resonator temperature.

Because the crystal resonator has a very high Q, it is the crystal which substantially determines the frequency of oscillation. Remaining oscillator components have relatively little effect on the frequency of oscillation, even for temperature-induced parameter changes. Embodiments of the present invention take advantage of the realizations that heating power can be reduced by maintaining only the resonator at a constant elevated temperature, and that small frequency shifts caused by temperature-induced changes in other oscillator components can be safely disregarded.

The invention also takes advantage of the realization that additional power reduction can be achieved by applying heat directly to the resonator. In conventional practice, the resonator enclosure, not the resonator itself, is heated. Because the resonator enclosure is evacuated, heat is not conducted efficiently into the resonator. The only significant path for heat conduction into the resonator is through the resonator support posts 108. These posts, being long and thin, present a significant thermal resistance. ("Thermal resistance", in this sense, refers to a resistance to heat flow.)

The posts themselves are insulated from the resonator enclosure by glass seals 109. The glass seals 109 not only provide electrical insulation for the resonator support posts 108 where they penetrate the enclosure 104, but also serve to thermally insulate the support pins, thereby constituting a portion of the significant thermal resistance between the resonator 114 and its enclosure 104.

In the present invention, the previously unexploited thermal isolation of the resonator is used to advantage. According to embodiments of the present invention, the resonator is heated by an electrically resistive element deposited directly on its surface. In this implementation, the thermal resistance of the resonator support pins helps reduce the overall oscillator power consumption. Other oscillator components are warmed only to a small degree by the heat that incidentally leaks out of the enclosed resonator.

Efficient control of heating current is necessary to realize a low-power temperature-controlled oscillator.

In conventional practice, a variable-resistance pass element, typically a transistor, is used to vary the heating current. The principle of voltage division ensures that, undesirably, a sizable portion of heater power is dissipated in the control device instead of the heating element. Usually, this heat is recovered by mounting the control element directly on the temperature-controlled structure.

In contrast, according to the present invention, heat dissipation in the heater control device is effectively eliminated by employing pulse width modulation of the heater current. Heating power is conserved by applying it directly and solely to the resonator.

The above teachings may be combined with improved methods for sensing resonator frequency variation as a function of temperature. Reliable, simple and accurate temperature sensing is needed for responsive control of frequency in temperature feedback systems such as those described above. Dual mode temperature sensing is known in the art: it is disclosed, for example, in U.S. Pat. No. 4,872,756 (Schodowski). Also, U.S. Pat. No. 4,079,280 (Kusters et al.) discloses use of the B mode and C mode signals for temperature compensation of an SC-cut resonator oscillator. Specifically, Kusters et al. use a correction factor signal which controls the temperature of an oven; no direct resonator heating is involved. Other patents disclose use of multiple frequencies from a resonator or use of frequencies from multiple resonators; such patents include U.S. Pat. No. 4,537,515 (Dinger et al.), U.S Pat. No. 4,489,289 (Slobodnik et al.), U.S. Pat. No. 4,468,634 (Takagi et al.), U.S. Pat. No. 4,345,221 (Zumsteg), and U.S. Pat. No. 4,160,183 (Kusters et al.). All patents mentioned in this specification are incorporated herein by reference as if reproduced in full below.

None of these patents disclose direct resonator heating. Similarly, none of them disclose a combination of direct resonator heating with such features as dual mode temperature sensing or certain implementations of feedback control or power reduction which are present in various embodiments of the present invention. Also, such problems as dropouts, hysteresis effects, and spurious output signals have not been efficiently solved in known dual mode systems, causing operational problems to arise in certain scenarios.

According to the present invention, the advantages of dual mode temperature sensing are combined with the various other advantageous features disclosed herein. Dual mode temperature sensing provides fast, accurate resonator temperature determination, allowing temperature feedback control of resonator heating to effectively eliminate resonator temperature variation. This system of temperature sensing improves frequency-temperature performance without compromising other performance parameters such as phase noise and aging. The invention allows better frequency-temperature performance than known temperature-compensated oscillators (TCXO's) with comparable power consumption; it further provides frequency-temperature performance comparable to known oven-controlled crystal oscillators (OCXO's) but with substantially less power consumption.

The present invention further provides a hybrid control temperature control scheme involving concurrent use of the above teachings. A system based on sensing the resonator case temperature provides coarse heating control especially during warm-up, when dual mode temperature sensing can experience drop-outs. Feedback from the dual mode temperature sensing system fine-tunes heater control, thereby improving performance. Finally, spurious output signals arising from temperature sensing oscillation mode are eliminated through such techniques as filtering, phase locking to a second oscillator, or direct digital synthesis.

In summary, the present invention overcomes the disadvantages of known temperature controlled oscillators, as described above. As will be appreciated by reading the following disclosure, heating power expenditure is minimized by one or more of the following features:

1) employing a lowered set temperature made feasible by use of an unconventional FC-cut crystal resonator;

2) a reduction of the heated volume, thereby reducing heat loss;

3) use of previously unexploited thermal isolation of the resonator by heating the resonator directly with a heating element (such as a resistive heating element), the heating element placed substantially directly on the surface of the resonator;

4) use of pulse width modulation to control the heating current with maximum efficiency;

5) use of various heater control schemes, particularly digital schemes such as duty-cycle regulation schemes, including pulse width modulation, pulse frequency modulation and software-controlled pulse width or pulse-frequency control, to efficiently control heating current;

6) use of dual mode temperature sensing to control resonator heating current;

7) use of a hybrid control system, in which direct temperature sensing substantially governs resonator heating during a warm-up period but dual mode temperature sensing thereafter substantially controls resonator heating, thereby circumventing hysteresis and drop-out effects common to known dual-mode and temperature-regulated systems;

8) use of an insulative support structure to provide further thermal isolation of the resonator, optionally with a temperature sensor deposited on the insulative support structure; and/or 9) inclusion of two elements in the same resonator enclosure, a first element possibly being provided with direct heating but not necessarily being a resonator providing a signal used as an oscillator output signal, and a second element being a resonator; this arrangement conserves power and provides additional thermal isolation to the second element while optionally provide responsive temperature control by using the first element as a resonator in a dual mode temperature sensing arrangement.

Furthermore, various embodiments of the present invention may include one or more of the following features, as recited in the claims which follow this specification.

A resonator, which may be a quartz crystal, is situated in a substantially evacuated enclosure so as to reduce thermal conductivity between the resonator and its enclosure. A heating element is deposited substantially directly on the resonator surface. The heating element is designed to controllably add thermal energy to maintain the resonator at a desired temperature.

A temperature sensor is attached to the crystal enclosure, and may be sandwiched between the crystal enclosure and the circuit board to which the crystal enclosure is attached. A control unit converts the sensed temperature into signal (such as a series of variable-width pulses) to be applied to the resonator heating element. Thus, the sensor, control unit and heating element comprise a temperature-feedback control system which allows the crystal resonator to reliably operate at or very near its desired temperature.

The crystal enclosure and accompanying oscillator circuitry may be surrounded by thermally insulative material, thereby further reducing the power consumption of the unit. Thermal insulation minimizes heat loss from the resonator, and also plays a substantial role in the function of the inventive temperature-feedback control system.

Furthermore, using an FC-cut resonator in certain preferred embodiments allows the resonator set temperature to be well below the highest expected ambient temperature without loss of frequency accuracy, thus achieving additional power savings. The minimum temperature coefficient region of an FC-cut resonator falls at a temperature much lower then that of crystal cuts commonly used in temperature controlled oscillators. The minimum temperature coefficient region is also much broader. The set temperature can therefore be lowered without incurring an unacceptable frequency deviation at high ambient temperatures.

In an especially preferred embodiment, an integrated circuit originally intended for use in switching power supplies may be used in a novel manner to perform certain of the functions in the temperature feedback loop control circuitry, thus simplifying implementation of these functions.

Other objects, features, and advantages of the present invention will become apparent upon a reading of the accompanying disclosure.

BRIEF DESCRIPTION OF THE DRAWINGS

The invention is better understood while reading the following Detailed Description of The Preferred Embodiments in conjunction with the accompanying drawings, in which like reference numerals refer to like elements throughout, and in which:

FIG. 1A is a schematic representation of the preferred embodiment of a temperature-controlled frequency-stabilized oscillator according to the present invention.

FIG. 1B is a perspective view of the crystal resonator and heater elements of FIG. 1A, with a top portion of the crystal enclosure removed for purposes of demonstration.

FIG. 1C is a top plan view of the crystal and heater elements, shown as a top view of FIG. 1B.

FIG. 2 is a schematic diagram illustrating how the thermal resistivity concepts employed in the present invention may be thought of in terms of a voltage divider circuit driven by a series current source, for the purposes of facilitating an understanding of the present invention.

FIG. 8 shows the connection of FIGS. 8A and 8B.

DETAILED DESCRIPTION OF THE PREFERRED EMBODIMENTS

Figure 3:
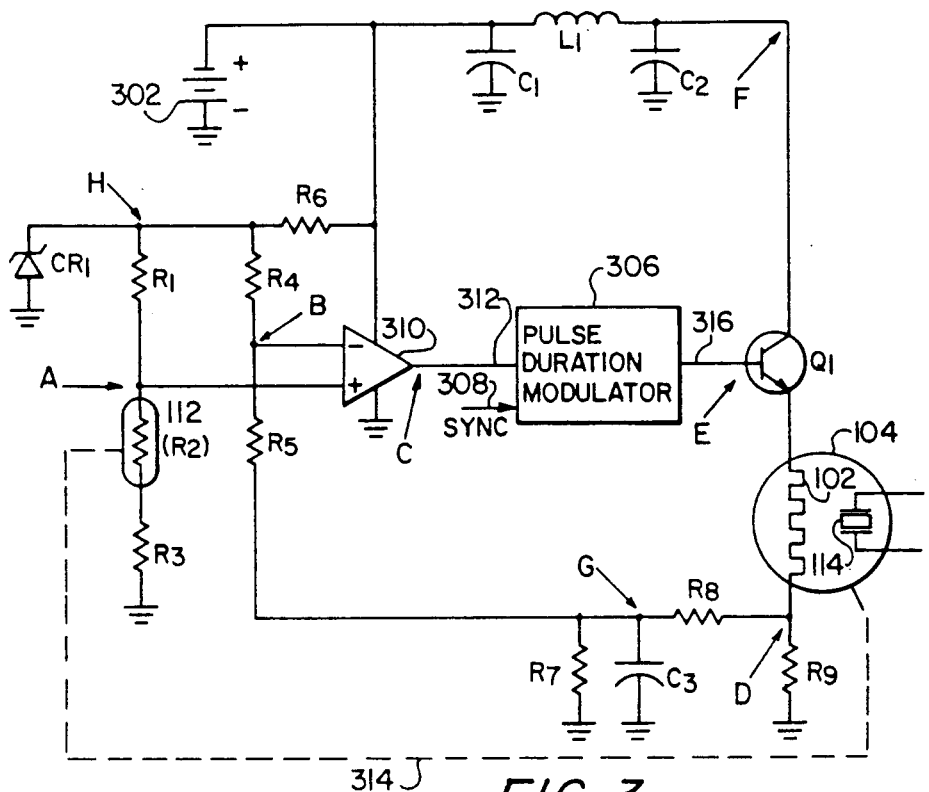
FIG. 3 is a circuit diagram illustrating the temperature control feedback according to a discrete component embodiment of the present invention.

In describing the preferred embodiments of the subject invention illustrated in the drawings, specific terminology will be employed for the sake of clarity. However, the invention is not intended to be limited to the specific terms so selected, and it is to be understood that each specific term includes all technical equivalents which operate in a similar manner to accomplish a similar purpose.

Further, the specification is divided into labelled sections solely for the sake of clarity of presentation. Teachings are not intended to be applied only to embodiments described in that section. Teachings which are present in one section may readily be applied to embodiments described in other sections, in accordance with principles known to those skilled in the art. In this manner, various combinations of the teachings may be made to one embodiment, while still remaining within the scope of the invention as defined by one or more claims which follow this specification.

Resonator temperature is a major factor controlling the oscillator frequency, the temperature coefficient for the oscillator as a whole being small in comparison. For this reason, heating power can be conserved by heating only the resonator, the remaining oscillator circuitry warmed only by whatever heat escapes from the resonator.

In an embodiment shown in cross-section in FIG. 1A, a thin film resistance heating element 102 is deposited on the surface of the resonator 114. The heater resistance 102 may be applied with the same vapor deposition process used to deposit the electrodes in the normal manufacture of the crystal resonator. The physical thickness of the thin film heating element is limited in order to increase its electrical resistance. Typically, the resistance of the heating element should be approximately an order of magnitude larger than the leads carrying current to it, so that a maximum amount of the thermal energy released due to resistive heating is released on the resonator surface. Electrical current passing through heating element 102 thus heats the resonator 114 directly.

The quartz resonator is sealed inside an evacuated enclosure 104 to improve and preserve its performance. Resonators are advantageously enclosed in an evacuated enclosure to avoid the detrimental effects of atmospheric exposure. Air dampens the vibration of the resonator, increasing energy loss and lowering the resonator quality factor Q. Atmospheric oxygen and water vapor also oxidize the electrode material and contaminate the surface of the resonator itself causing a slow drift of the resonator resonant frequency known as aging.

According to the present invention, the evacuated enclosure also acts as an effective insulating layer. The vacuum's insulative effect can easily exceed that of several cubic inches of material insulation external to the resonator enclosure.

FIGS. 1B and 1C are perspective and top plan views, respectively, of a preferred embodiment of the crystal resonator 114, heating element 102, mounting leads 107, 108 and a portion of the crystal enclosure 104. As shown, a crystal resonator is preferably implemented with an FC-cut, for reasons discussed elsewhere in this specification.

The resonator design and manufacture deviates from conventional practice in the substantially direct attachment of the heating element 102, as described above. Two additional support pins 107, not found in known structures, provide electrical connection to the heater element. Support pins 108 provide electrical connection to the resonator electrodes, and may be implemented as in a conventional crystal resonator.

The illustrated resonator has a circular shape. Of course, the present invention may be practiced using resonators and/or heating elements other than those specifically described above.

Thermal Model

A thermal model, shown in FIG. 2, conceptually describes the function of the thermal control function employed in the inventive oscillator illustrated in FIGS. 1A, 1B and 1C. Simple thermal calculations are performed by analogy with Ohms Law in elementary circuit theory.

Heat flow (in watts) is analogized to electrical current. A heat source is modelled as a current source. Temperature difference corresponds to voltage. Thermal insulation is a resistance to heat flow, with units degrees Centigrade per Watt. In this analogy, a temperature difference corresponds to a voltage drop.

In the exemplary unit shown schematically in FIG. 1A, heat is applied directly to the resonator blank 114 by passing a pulsating electrical current I, generated by supply voltage V, through an electrical resistance R. I and V denote the average value of a duty cycle-modulated pulse train. Applied heat, represented in terms of voltage or current, equals $V^2/R$ or $I^2R$, respectively. Heat is applied to the resonator continuously so as to maintain a stable regulated temperature, to counteract the effects of heat loss to the outside surface 116. Because the resonator enclosure 104 is evacuated, heat flow is primarily by conduction through the resonator mounting pins 107 and 108 (FIG. 1B). The resonator enclosure 104, surrounded by thermal insulation 110, is warmed by heat passing through the resonator mounting posts. Likewise, the oscillator circuitry 118 is also warmed because it is in thermal contact with the resonator enclosure via printed wiring board 120.

The path taken by heat as it flows from the resonator 114 to the outside surface 116 through the elements mentioned above can be represented by two thermal resistances, $R_X$ and $R_A$. The first resistance $R_X$ is the resistance to heat flow between the resonator 114 and its evacuated metallic enclosure 104. The resonator mounting posts 108 and the glass seals 109 which electrically isolate the posts from the resonator enclosure make up this thermal resistance.

The second thermal resistance $R_A$ represents the resistance to heat flow between the resonator enclosure and the ambient environment. It comes primarily from the thermal insulation 110 packed inside the oscillator volume, but external to the resonator enclosure.

Suitable insulator material includes fiberglass products available from OWENS-CORNING FIBERGLASS CORP., Appliance and Transportation, Insulation Marketing Division, Fiberglass Tower, Toledo Ohio 43659, and cellular Polyisocyanurates foam insulation available from DOW CHEMICAL U.S.A., Urethanes Department, Midland, Mich. 48674.

The external dimensions of the temperature-controlled oscillator set an upper limit on the quantity of insulation used.

The temperature of the crystal enclosure 104 is sensed by (for example) a thermistor 112, and is used in a feedback control loop to regulate the heat applied to the resonator. The objective is to maintain the resonator temperature, even as the ambient temperature drops to some lower limit (of $-20°$ C. in the example of a satellite-based positioning system). Heat loss due to conduction must be compensated for by the heating element 102. A continuous match between heat lost and heat replaced is needed to exactly stabilize the resonator temperature.

Heat loss by the resonator is directly proportional to difference between the temperature of the resonator and its enclosure, divided by the thermal resistance $R_X$. This relationship is the basis for a temperature controller that adds heat linearly as the resonator enclosure temperature at 104 drops below a set threshold.

The resonator-to-enclosure thermal resistance $R_X$ is substantially determined by the mechanical design of the resonator mounting structures 107, 108, 109 and enclosure 104. For this reason, variations from unit to unit are small, and $R_X$ can be assumed to be constant. The enclosure-to-environment thermal resistance $R_A$ is determined substantially by the external insulation layer 110. The resonator enclosure temperature is the only unknown in the resonator heat loss calculation, and can be measured by a variety of temperature sensors.

As is known in the art, thermistors have a feature of a substantially linear resistance variation as a function of temperature, a feature which is employed to advantage in the preferred embodiment. The temperature sensor 112, as used in embodiments of the present invention, is an input for a control circuit (within FIGS. 3 or 5) that controls the supply of heat to the resonator. The control circuit is designed to have a transfer function $G_X$, with units Watts per °C. The transfer function $G_X$ may be thought of as a thermal conductance ideally equal to the reciprocal of the enclosure-to-ambient thermal resistance $R_X$.

Effects of External Insulation

Briefly, external insulation reduces the overall heat loss and provides negative feedback to the thermal control system, to advantageously reduce control errors. To clarify the role of external insulation, the operation of the temperature controller is described hereafter with and without external insulation.

Without external insulation the sensor temperature approaches the ambient temperature. The controller then applies heat to the resonator as the enclosure temperature drops below a specific set temperature. Heat is applied in proportion to the temperature drop. The accuracy of the temperature regulation is determined by how closely the temperature controller's gain $G_X$, measured in °C. per Watt, matches the thermal resistance $R_X$, which has reciprocal units Watts per °C. No thermal feedback exists to reduce the regulation error if the match is not perfect.

Also, without external insulation, the oscillator circuitry is exposed to the full range of ambient temperature excursions, and the heater power consumption is limited only by the resonator thermal resistance $R_X$.

In contrast, in the presence of external insulation, the temperature of the resonator enclosure and its attached temperature sensor falls between the resonator set temperature and ambient temperature. Employing the voltage divider analogy shown in FIG. 2, the enclosure temperature corresponds to the voltage at the junction of two thermal resistances $R_X$ and $R_A$. The first thermal resistance is between the resonator and its enclosure; the second thermal resistance is that presented by the external insulation between the resonator enclosure and the ambient temperature.

Given a large quantity of external insulation, $R_A$ is much greater then $R_X$, and, under steady state conditions, the sensor temperature is substantially equal to the resonator temperature. Consequently, thermal feedback is present and the temperature controller operates in a substantially closed loop fashion. Should the resonator be heated excessively, the sensor temperature would soon rise in response, causing the controller to expeditiously reduce the heating current applied to the resonator. This corrective action of reducing the heating current is a manifestation of the closed-loop thermal feedback feature according to the present invention.

External insulation also lowers power consumption by reducing heat loss and reducing the temperature excursions experienced by the oscillator circuitry. This lowering of power consumption and reduction of temperature excursions occurs because insulation improves the heating efficiency of the unit, even in the presence of some heat leaking out of the resonator enclosure. The amount of external thermal insulation, and the resultant benefit to oscillator operation, is generally limited by the external dimensions of the oscillator, and these in turn are defined by specification. Presence of a smaller amount of external insulation preserves some of the beneficial effects of thermal feedback, but to a correspondingly lesser extent.

Exemplary Circuit Description

FIG. 3 is a circuit diagram illustrating a preferred embodiment of the oscillator feedback control circuit according to the present invention. The structure of the illustrated circuit is as follows.

A battery 302, extending between VCC and ground, provides power for the circuit. In a positioning system in which a target transmitter is powered by a portable energy source, such as a battery, the conservation of this energy is of prime importance.

VCC is also connected to respective first ends of inductor L1, capacitor C1, resistor R6, as well as powering an amplifier 310. The second end of inductor L1 is connected to a first end of capacitor C2, as well as to the collector of a switching transistor Q1. The respective ends of capacitors C1 and C2 are connected to ground.

The second end of resistor R6 is connected to respective first ends of resistors R1 and R4, as well as to the cathode of a Zener diode CR1. The anode of Zener diode CR1 is connected to ground. The second end of resistor R1 is connected to the non-inverting input of amplifier 310, as well as to a first input of thermistor 112 (R2) which functions as a sensor. The second end of thermistor 112 is connected to a resistor R3, whose opposite end is connected to ground. The dotted line 314 extending from thermistor 112 to a crystal enclosure 104 indicates that the thermistor 112 is, in this preferred embodiment, in thermal contact with the crystal enclosure 104.

The second end of resistor R4 is connected to the inverting input of amplifier 310 as well as to a first end of a resistor R5. The second end of resistor R5 is connected to respective first ends of resistors R7, R8 and capacitor C3. Respective second ends of resistor R7 and capacitor C3 are connected to ground.

Figure 3A:
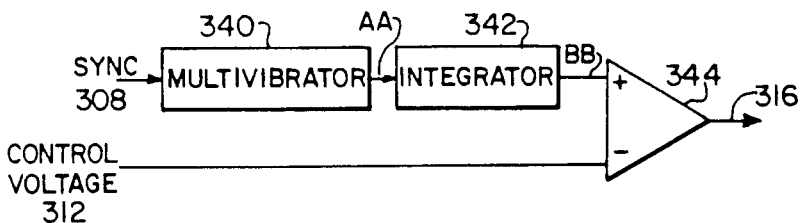
FIG. 3A is a diagram illustrating a preferred embodiment of the pulse duration modulator in FIG. 3.
Figure 3B:
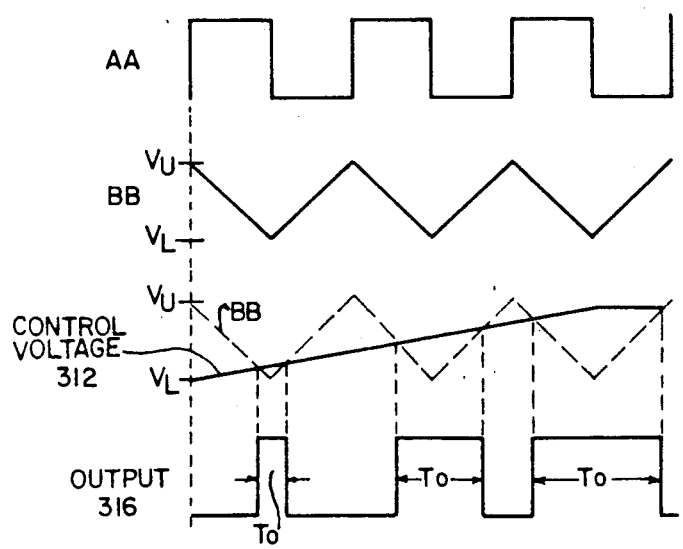
FIG. 3B illustrates waveforms at various locations in the pulse duration modulator shown in FIG. 3A.

The output of amplifier 310 controls the pulse duration modulator 306 along path 312. Pulse duration modulator 306 may be synchronized to an external signal via the SYNC input. This feature is useful in controlling interference that might result from transients occurring at the pulse switching rate. The pulse duration modulator 306 produces a train of pulses with durations proportional to the control voltage appearing on path 312. The pulse generation process is depicted in FIGS. 3A and 3B and is described in greater detail below.

The output of pulse duration modulator 306 controls the switching of switching transistor Q1 by direct connection to its base. The emitter of switching transistor Q1 connects to one end of the resonator heating element 102.

As described earlier, the heating element is preferably deposited directly onto the surface of the resonator along the outside edge of the resonator blank. This arrangement is depicted schematically in FIG. 3 by the circle 104 surrounding the heating element 102 and resonator 114.

The second end of heating element 102 is connected to the second end of resistor R8 and a first end of a resistor R9. The second end of resistor R9 is connected to ground.

Circuit Operation

Still referring to FIG. 3, and additionally FIGS. 3A and 3B, the resonator temperature is controlled by varying the duration of a series of voltage pulses applied to the heating element 102 on the surface of the resonator. Because the illustrated voltage pulses occur at a fixed rate, resonator heating is linearly proportional to the pulse duration. The pulse rate may be determined by an R-C oscillator contained within the pulse duration modulator, employing components Rt and Ct. Transistor Q1, driven by the pulse duration modulator, generates the heating pulses. Components C1, C2, and L1 constitute a filter network which smoothes the pulsating current drawn from the battery power supply 302.

Resistors R1 through R5 make up a balanced bridge circuit. A stable voltage to operate the resistance bridge comes from a Zener diode voltage regulator employing a Zener diode CR1, and a current-limiting resistor R6.

A thermistor 112, also designated R2, senses the temperature of the resonator enclosure. Because the thermistor has a negative temperature coefficient, a drop in temperature increases both the thermistor resistance and the voltage at Point A. When the bridge circuit is balanced, the voltages at Point A and at Point B (FIG. 3) are equal. The voltage at Point A is a function of resonator enclosure temperature; the voltage at Point B is a function of resonator heating current. A servo circuit comprising a differential amplifier, a pulse duration modulator and a current switch, adjusts the average resonator heating current to maintain the balance of the bridge. If the resonator enclosure temperature drops, the action of the servo circuit increases the heater current.

A stable zener regulated voltage energizes the bridge circuit which in turn is set up to balance at half the applied voltage. This means the total resistance of R2 and R3 must equal the resistance R1, the three resistances thus forming a two-to-one voltage divider. Resistances R4 and R5 on the other side of the bridge, having equal resistances, comprise a second two-to-one voltage divider. Resistances R8 and R9 have negligible effect upon the balance of the bridge because their resistance is much smaller than either R4 or R5. They do, however, make up a voltage feedback path.

Because the individual heater element (102) resistances may vary from unit to unit, and since the battery (302) voltage VCC will decrease with time as the battery is exhausted, the actual heating current is monitored by means of a current sensing resistor R9. During operation, a pulsating voltage is developed across R9, which is applied to an RC filter (R7, C3 and R8) to smooth out switching frequency ripple. The voltage G at the junction of R7, C3 and R8, representing the average heater current, is fed back to the reference leg of the thermistor bridge through R5. This causes the bridge voltage at Point B to increase as the heater current increases. R7 and R8 comprise a voltage divider which sets the magnitude of the negative feedback and therefore determines the gain of the control circuit.

Operation of the Pulse Modulator

Referring to FIGS. 3A and 3B, the pulse duration modulator controls the resonator heating current. As the temperature of the resonator case drops below the set temperature, the pulse duration increases in proportion.

As shown in FIGS. 3A and 3B, the pulse duration modulator 306 follows standard engineering practice and consists of a multi-vibrator 340, an integrator 342 and a comparator 344. The multi-vibrator generates a symmetrical square wave AA used to generate a triangle wave. Linearity of the pulse duration modulator depends upon the symmetry of the triangle wave and the square wave from which it is derived.

Integration of the square wave produces a triangle wave BB which is applied to an inverting terminal of the voltage comparator 344, with the amplified control voltage 312 from the thermistor bridge applied to the non-inverting input. The output 316 of the comparator is a pulse train; the duration of the pulses are advantageously a substantially linear function of the control voltage 312. When the pulse train 316 crosses the threshold defined by the control voltage 312, the output 316 of the comparator 344 changes state. As the control voltage 312 varies, so does the duty cycle of the comparator output signal 316.

Exemplary Component Values

Although the invention may be practiced using a variety of component values, based upon considerations known to those skilled in the art, the following component values are believed practicable in the embodiment of FIG. 3:

| Component | Value/Type |
|---|---|
| C1 | 3.3 Microfarads |
| C2 >= C1 | 3.3 Microfarads |
| C3 | 0.1 Microfarads |
| L1 | 39 Microhenries |
| Q1 | 2N2222 or equivalent |
| R1, R2, R3 | R1 = R2 + R3 at resonator set temperature |
| R4 | 180K Ohms |
| R5 | 180K Ohms |
| R6 | 1.6K Ohms |
| R7 | 40K Ohms |
| R8 | 10K Ohm |
| R9 | 25 Ohms |
| CR1 | 5.1 V Zener diode; 1N751 or equivalent |
| Heating Element 102 | 400 Ohm |
| Crystal 114 | FC cut (see Detailed Description) |
| Battery 302 | 10.0 Volts |

Component values refer to FIG. 3. Derivations of values for components may be made in the following manner, presented as guidelines for illustrative purposes only.

Assume a crystal set temperature of 30° C. and a minimum ambient temperature of −20° C. With these assumptions, the maximum temperature difference between the resonator and its case is 50° C. The measured thermal resistance from the resonator to the case for a TO-8 style case is 248° C./W. The thermal conductance is then $4.03 \times 10^{-3}$ W/°C. and approximately 200 milliwatts is needed to maintain the resonator at the minimum ambient temperature.

$$(4.03 \times 10^{-3} \text{ W/°C.}) (50° \text{ C.}) = 200 \text{ mW}$$

Assume the resonator heater resistance totals 400 ohms and the battery voltage 10.0 volts. Ten volts continuously applied to a 400 ohm load dissipates 250 milliwatts. Under these conditions, an 80% duty cycle pulse train gives the heater power (200 mW) needed for a 50° C. temperature rise.

$$(0.80) (10 \text{ V}^2/400) \text{ ohms} = 200 \text{ mW}$$

$$(\text{Duty Cycle}) (\text{Voltage})^2 (1/\text{heater resistance}) = 200 \text{ mW}$$

and $$\text{Average Heater Current} = 200 \text{ mW}/10 \text{ Volts} = 20 \text{ mA}$$

The voltage drop across R9 indicates the current flowing through the heater resistance. A larger resistance value for R9 gives a larger indication but also wastes heating power. Limiting dissipation in R9 to 5% of the heater power gives a voltage drop across R9 equal to 0.5 volts. With 20 mA heater current:

$$R9 = (0.05) (10.0 \text{ V})/20 \text{ mA} = 25 \text{ ohms}$$

Voltage division across R6 and R9 provides a means to adjust the gain of the thermal controller. This way production variations of the heater resistance can be compensated. Assume a twenty percent adjustment range is necessary. R8 and R7 are then selected to reduce the voltage across R9 by twenty per cent. For the crystals with nominal heater resistance, no changes are necessary. Crystals with heater resistance above (below) nominal values are compensated by increasing (decreasing) the value of R7.

Resistor R8 also provides a filtering function in conjunction with C3. Choosing R8 equal to ten thousand ohms, and C3 equal to 0.1 microfarad, gives a low pass filter with a 6 dB cutoff point of 160 Hz and a six dB per octave roll-off. Resistor R7, 40 K, forms the voltage divider discussed above. Attenuation at the 50 kHz pulse frequency is sufficient to provide a ripple free feedback voltage.

As determined earlier, 20 mA of heater current is needed to maintain resonator temperature with the crystal enclosure at −30° C. At this temperature the following circuit voltages exist with R7 and R8 selected for a twenty percent adjustment range:

Voltage at Point D = (20 mA) (25 ohms) = 0.50 volts

Voltage at Point B = (Vref/2) + (0.50 V) (R7)/(R7+R8)

Voltage at Points B = (Vref/2) + 0.4 volts

This servo action of the control circuit forces the voltage at Points A and B to be equal. Because thermistor resistance is a linear function of temperature, the voltage at Point A also varies linearly with temperature. This sets up a relationship between heater current and bridge voltage at Point B which enables determination of the resistance of R1, R2, and R3 and the thermistor (R2) temperature coefficient.

L1, C1 and C2 comprise a filter network that reduces the switching frequency ripple that might otherwise modulate the power supply voltage. C2 is a large value electrolytic capacitor. Assume a value of 3.3 microfarad. The reactance at the switching frequency (50 kHz) is then just under 1 ohm. The inductor should be as large electrically as possible without exceeding physical size and DC current limitations. The minimum inductance reactance at the switching frequency should be significantly larger than the shunt capacitor reactance. This translates into a minimum inductance of about 16 microhenry with the 3.3 microfarad capacitor given earlier. A 1025 series 39 microhenry inductor (manufactured by the Delevan Division of American Precision Industries, 270 Quaker Road, East Aurora, N.Y. 14052) having a DC resistance of 3.6 ohms and a maximum current rating of 125 mA is suitable. Capacitors C1 and C2 may be equal values, but if one must be larger, it should be C2. Capacitor-inductor combinations that are series resonant at the switching frequency should be avoided.

The pulse duration modulator can be advantageously locked to a sub-harmonic of the resonator frequency by injecting a synchronizing signal into the SYNC input. In this way, intermodulation between the oscillator and transients arising from operation of the pulse duration modulator is controlled. Intermodulation products may still be present, but because the oscillator and the switching frequencies are integer multiples, spurious beat notes less than the switching frequency are not possible. Thus, oscillator short-term stability is preserved in the presence of switching frequency transients without extensive filtering or voltage regulation.

The crystal oscillator can be implemented with discrete components or as an integrated circuit gate oscillator. A 4040 or 74HC4040 CMOS integrated circuit may be used (see FIG. 5). In this alternative embodiment, an inverter serves as the oscillator gain element, and is followed by a frequency divider chain. The divider chain can supply a subharmonic oscillator output or be used to synchronize the pulse duration modulator.

Placement of Thermal Sensor

Figure 4:
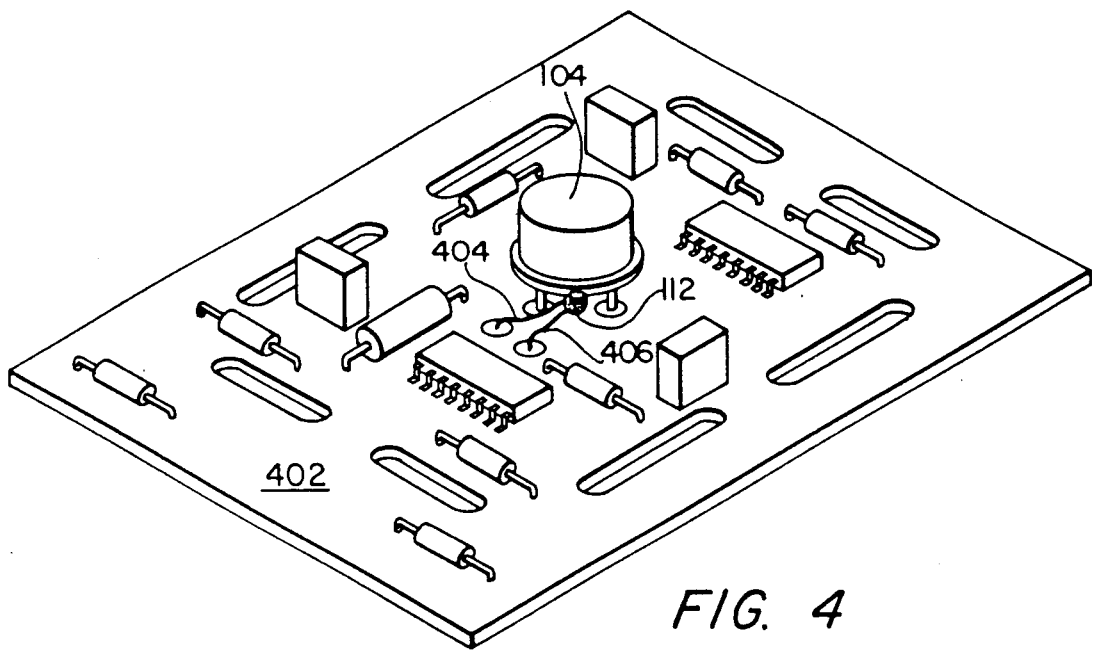
FIG. 4 is a perspective view of a circuit board illustrating the placement of an oscillator and a thermal sensing unit according to a preferred embodiment of the present invention.

FIG. 4 illustrates a circuit board on which a thermal sensor 112 (such as a thermistor R2 in FIG. 3) is sandwiched between the oscillator body 104 and the circuit board 402. Leads 404 and 406 connect the thermal sensor 112 to other circuit components, such as bridge resistors R1 and R3 (FIG. 3).

In contrast to known temperature-controlled feedback systems, the present invention provides for placement of the thermal sensor between the oscillator package and the circuit board. The thermistor is commonly attached to the top or side of the resonator enclosure or it is attached with adhesive to a metallic heat spreading structure containing and surrounding the resonator case. The method described herein eliminates the manufacturing step of affixing the thermal sensor to the resonator case or to the heat spreading structure. Because the resonator must be affixed to the circuit board in any event, the initial placement of the thermal sensor on the target location for the oscillator causes a merger of the sensor attachment and resonator insertion steps of the manufacturing process. A thermally conductive compound can be used to insure good thermal contact between the sensor and the resonator enclosure.

Pulse Duration Modulator Construction

Figure 5:
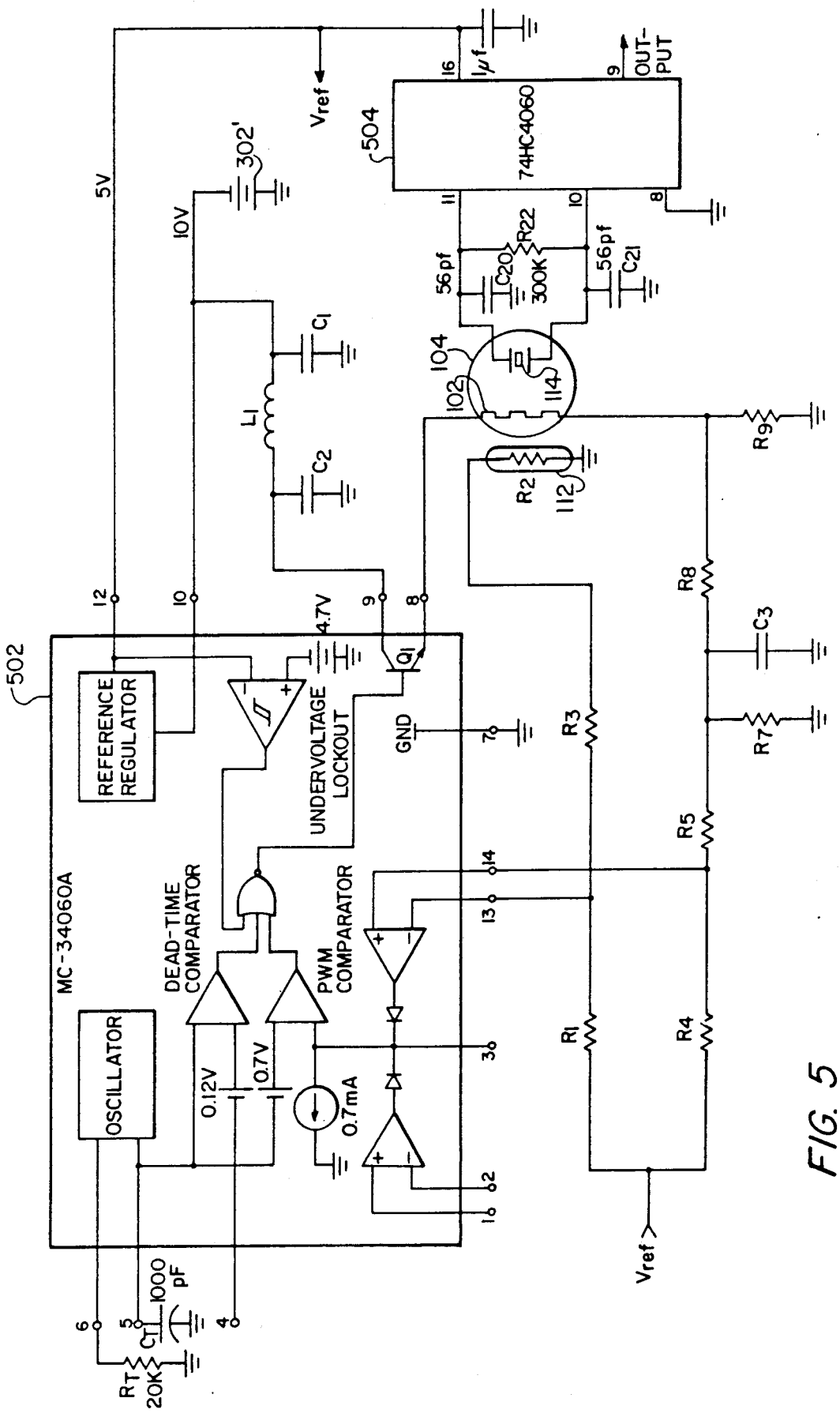
FIG. 5 is a circuit diagram showing how certain of the functions and elements in FIG. 3 may be implemented using an integrated circuit normally employed in switching power supplies.

While the pulse duration modulator may be constructed from discrete components, a more cost-effective and novel approach is to use the pulse modulator section of a standard integrated circuit meant for use in a switching power supply. The operational amplifier 310, the switching element Q1, the pulse duration modulator 306 and the voltage regulator CR1 (FIG. 3) are available on switching power supply integrated circuits, one of which is illustrated in FIG. 5. Appropriate integrated circuits include Motorola MC-33060A, MC-34060A, MC-35060A; National LM-1578, LM-2578, LM-3578; Texas Instruments MC-34060.

FIG. 5 is a circuit diagram illustrating the novel use of a switching mode pulse width modulation control circuit (designed for switching mode power supply control). In a preferred embodiment, an MC-34060 is employed. This integrated circuit is available from Texas Instruments, Inc., P.O. Box 655012, Dallas, Tex. 75265, and is described in the 1989 edition of the Texas Instruments *LINEAR CIRCUITS DATA BOOK*, Volume 3, pages 2-81 through 2-87.

Referring more specifically to FIG. 5, the switching mode circuit 502 is employed in implementing the circuit of FIG. 3 in the following manner. Pin 6, $R_T$, is connected to ground through a resistance having a value of 20K ohms. Pin 5, $C_T$, is connected to ground through a capacitor having a value of 1000 picofarads giving a 50 kHz switching frequency. Pin 4, the dead-time control input, may be left un-connected. Pins 1 and 2, the non-inverting and inverting inputs to the first error amplifier and pin 3, the non-inverting input to the PWM comparator, are also left un-connected. Pin 10, VCC, is tied directly to the voltage source 302, providing a 10 volt input to a reference regulator internal to the switching mode chip 502. The internal regulator provides a regulated 5.0 volt source accessible to external circuitry via pin 12. The voltage pulses applied to the resonator heating element 102 are generated by transistor Q1. Its collector, accessible by pin 9, is connected to the 10 volt battery supply 302 through a ripple smoothing filter comprised of C1, C2, and L1 as described earlier. The emitter of Q1, accessible by pin 8, is connected directly to the resonator heating resistance 102. Pin 7 is connected to ground. Pins 13 and 14, the inverting and non-inverting inputs to a second error amplifier within the switching mode integrated circuit, are connected, respectively, to the nodes between resistors R1 and R3, and between R4 and R5. The inverting and non-inverting inputs are reversed with respect to FIG. 3 because of a polarity inversion in the pulse width modulator.

A voltage regulator internal to the switching mode integrated circuit 502 generates 5.0 volts available by pin 12 to power circuitry external to the integrated circuit 502. This voltage source, bypassed by a 0.1 microfarad capacitor, powers the balanced resistance bridge circuit shown in FIG. 3 and the crystal oscillator circuit implemented in FIG. 5 with a 74HC4060 integrated circuit 504. Regulated voltage with a magnitude of 5.0 volts is applied to pin 16 of integrated circuit 504. Pin 8 is ground. The resonator is connected to pins 10 and 11, as is a 300K ohm resistor. Pin 11 is connected internally to the input of a logic inverter; pin 10 connects to the gate output. The 300K ohm resistor serves to bias the digital gate into a quasi-linear mode enabling the gate to function as an amplifier which initiates and sustains oscillations in the resonator. Capacitors C20 and C21, connected respectively to integrated circuit 504 pins 11 and 10 provide a load for the crystal resonator and establish the phase shift necessary for oscillation. A logic level pulse train at the resonator frequency is available from pin 9 providing the output of the oscillator as a whole. Alternatively, outputs at several integral sub-harmonics of the resonator frequency are available from pins 1 through 7 and 13 through 15. These can serve as oscillator outputs instead of, or in addition to, the fundamental output on pin 9 or can be used to synchronize the switching frequency of the pulse duration modulator as discussed earlier.

All other portions of the circuit illustrated in FIG. 5 may function in the manner described above, with respect to FIG. 3. However, the switching mode chip 502 assumes the function of the FIG. 3 elements, the diode CR1, amplifier 310, pulse duration modulator 306, and switching transistor Q1. Also, thermistor 112 (R2) and resistor R3 may be switched in the order in which they are arranged in series. Also the oscillator which initiates and sustains oscillations in conjunction with the resonator 114 need not necessarily be implemented with a 74HC4060 integrated circuit. Other integrated circuits or discrete circuit embodiments may be employed.

The 74HC4060 14-stage binary ripple counter with oscillator employed in the preferred embodiment, is available from Motorola, and is described in the Motorola *High Speed CMOS Logic Databook* (1983) on page 5-395.

Preferred Resonator Cuts

In known temperature-controlled oscillators, the set temperature (and consequently the crystal resonator zero frequency temperature coefficient point) are placed significantly above the highest expected ambient temperature. Substantial energy is used to heat the resonator and associated oscillator circuitry to the elevated set temperature. After the oscillator is heated to the set temperature, resonator temperature must be controlled very closely even in the presence of large changes in ambient temperature, to achieve the desired frequency stability.

As described previously in the Background of the Invention, lowering the set temperature of a conventional temperature controlled oscillator to save heating energy is not feasible. Specifically, frequency accuracy is degraded if ambient temperature exceeds the oscillator set temperature. In this situation, control of the resonator temperature is lost and the oscillator frequency follows the resonator frequency-temperature curve. Because the range of zero frequency-temperature slope in conventionally-employed resonators is so narrow, a resonator temperature increase as small as one or two degrees Centigrade causes unacceptable frequency drift. For practical purposes, the "range" may even be considered a point on the curve.

Accordingly, the present invention uses a less common resonator cut that can be described as having a region (instead of a point) of acceptably low frequency-temperature slope.

Figure 6:
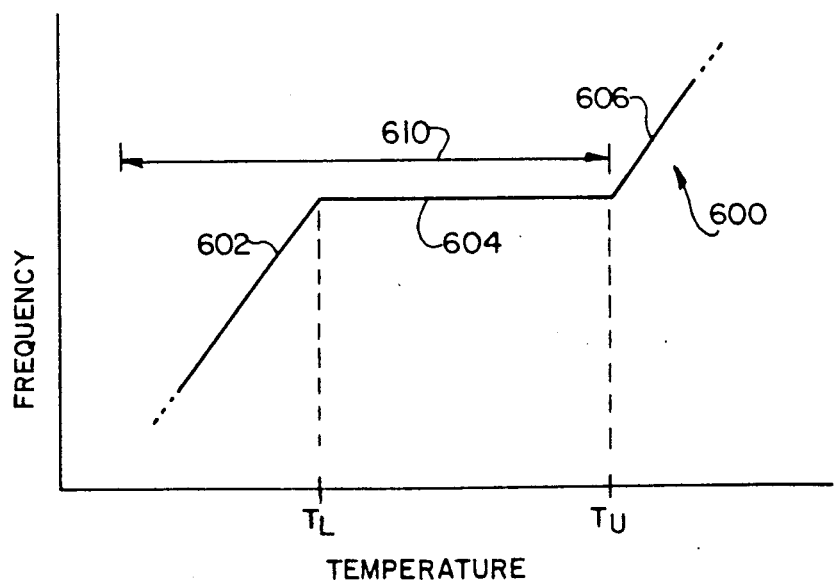
FIG. 6 is a frequency-temperature curve illustrating regions of zero and non-zero temperature coefficient, useful in explaining the operating point of embodiments of the present invention.

FIG. 6 is a frequency-temperature characteristic curve 600 having three segments 602, 604, and 606. The curve is illustrative of a properly oriented FC-cut crystal resonator. Lower segment 602 illustrates a temperature range in which the temperature coefficient is unacceptably large. Intermediate segment 604 illustrates a temperature segment between $T_L$ and $T_U$ in which the temperature coefficient is acceptably small. Finally, upper segment 606 illustrates a temperature range in which the temperature coefficient is again unacceptably large.

The FC-cut resonator has a broad flat segment in its frequency-temperature curve covering approximately $T_L = 30°$ C. to $T_U = 70°$ C. The set temperature of a temperature-controlled oscillator using such a resonator can be near or at the lower limit of the flat segment. In this case, the set temperature of oscillators according to the present invention can be less than the highest expected ambient temperature. The ambient temperature range is illustrated as segment 610.

Therefore, the temperature of the resonator is allowed to drift within the portion of the flat coefficient greater than $T_L$ but still less than the highest expected ambient temperature. Heat is needed only if the ambient temperature drops below $T_L$. Moreover, the resonator temperature need only be raised back to $T_L$, so that the resonator does not operate along the high coefficient segment 602.

Operating a crystal oscillator in a flat portion of the temperature characteristic curve within a segment of the expected ambient temperature range, and applying heat only below the lower temperature $T_L$, has several advantages. Power is saved because an unnecessarily high temperature need not be constantly maintained. Furthermore, because heat is applied only if the temperature drops down into the lower segment 602, additional power saving result when ambient temperature is above $T_L$ (in fact, the heating power requirement is zero). In this manner, substantial power savings is attained, without substantially compromising the oscillator frequency stability.

Thus, the invention may be further conceived as enabling a temperature-controlled oscillator for operation at actual ambient temperatures within an expected ambient temperature range, the oscillator comprising: a resonator for producing a signal having a desired frequency, the resonator having a temperature coefficient curve with a range in which the slope of the curve is substantially zero, the range substantially defined by a lower limit temperature $T_L$ and an upper limit temperature $T_U$, the lower limit temperature $T_L$ disposed substantially within the expected ambient temperature range and the upper limit temperature $T_U$ disposed approximately at or above an upper limit of the expected ambient temperature range, the resonator having an operational temperature which may vary as a function of time; a heating element for providing thermal energy to the resonator; a thermal sensor, for sensing a temperature substantially related to the operational temperature of the reasonator; and a control circuit for receiving the sensed temperature from the thermal sensor and for governing an amount of thermal energy which the heating element provides to the resonator, the control circuit causing the heating element to provide heat to the resonator only when the operational temperature of the resonator is a given amount below the lower limit temperature $T_L$; in which the control circuit does not cause the heating element to supply thermal energy to the resonator when the ambient temperature is above approximately the lower limit temperature $T_L$, so that energy is not expended in heating the resonator when the actual ambient temperature is above a certain temperature in the expected ambient temperature range; and in which the desired frequency is maintained substantially constant throughout the entire expected ambient temperature range.

Crystal resonator cuts other than the FC-cut may be used successfully and advantageously while remaining within the scope of the present invention. A doubly-rotated resonator such as the SC-cut is a prime example. SC-cut resonators have a frequency-temperature curve comparable to the FC-cut resonator shown in FIG. 6. However, the lower turn point occurs at a much higher temperature for the SC-cut resonator, 70°–85° C. instead of 20°–30° C. Though more electrical energy is needed to heat the SC-cut resonator to operating temperature, the SC-cut resonator has several advantages that make its use attractive in some applications, despite higher power consumption. Advantages of SC-cut resonators include reduced degradation with age, and low phase noise. Further, while the heater power is increased in SC-cut implementations, it is still much less than that consumed by typical known temperature-regulated or ovenized oscillators.

Further Embodiments

In the embodiments discussed above, the resonator temperature is controlled by sensing the temperature of the resonator enclosure and adjusting the resonator heating current accordingly. Two conditions should be satisfied for proper performance of the above embodiments. First, the thermal gain, or rate at which the controller increases the heating current as the resonator case temperature drops, must accurately match the rate at which the resonator loses heat as determined by the thermal resistance between the resonator and enclosure. Second, the temperature sensor and accompanying heater current controller should act in a substantially complementary fashion: in a simple implementation, both the temperature sensor and heater current act substantially linearly. Frequency stability is impaired if these two conditions are not fulfilled.

In practice, common temperature sensors are not completely linear, and it is not generally possible to match the controller thermal gain and the resonator thermal resistance without error. These limitations impair frequency stability.

Direct measurement of the resonator temperature (by placing a sensor directly on the resonator) would be ideal, were it not for several practical considerations. Such practical considerations include the practice of enclosing the resonator in an evacuated enclosure to reduce aging effects and prevent contamination. Further, mounting a temperature sensor directly on the surface of a crystal resonator causes detrimental damping effects that are unacceptable in high performance oscillators. Therefore, it is desirable to measure the temperature of the resonator itself while circumventing the limitations just described.

The temperature of a quartz crystal resonator used in an oscillator can be determined by simultaneously exciting two distinct resonant modes of the crystal, the resonant frequency of one or both modes being a function of temperature. Such an oscillator is known as a dual-mode oscillator.

Many resonant modes of vibration possible even in a simple mechanical structure such as a long flat slab which can be excited into flexural, extensional and torsional vibrational modes in each of its major dimensions with fundamental and overtone responses possible for each. Each resonance has its own unique frequency. Crystalline quartz is an anisotropic material; its physical properties depend upon the direction in which they are measured with respect to the natural axis of the crystal. Therefore the frequency-temperature characteristics are different for each resonant mode.

In a preferred embodiment, a dual mode oscillator is employed to sense the temperature of the resonator, the sensed temperature being used to control a feedback signal to control the amount of heat applied to the resonator. A first oscillation mode (such as the C mode in SC-cut resonators), is used as an output of the oscillator as a whole, and is selected to be stable with temperature. The desired resonance may advantageously be selected at a temperature or temperature range having zero frequency-temperature slope, just above the highest expected ambient frequency. In operation, the resonator is heated to this temperature so that small temperature variations do not cause objectionable frequency deviations. In contrast, a second oscillation mode (such as the B mode in SC-cut resonators), is used internally for temperature sensing, and is selected to have a strong temperature dependance.

A dual mode oscillator enables indirect self-sensing of resonator temperature by monitoring the frequency of the second oscillation mode, or, even more advantageously, the ratio between the two oscillation frequencies. For convenience, the ratio measurement may advantageously be performed upon the two oscillation frequencies after frequency multiplication or division of one or both signals.

Generally, a resonator cannot oscillate by itself. External amplification is needed to replace the energy dissipated by losses in the resonator. To this end, the resonator is placed in the feedback path between the amplifier's output and input. Two conditions, known as the Barkhausen criteria, must be satisfied to start and sustain oscillations. First, the total phase shift around the loop must be an integer multiple of 360 degrees, insuring successive cycles add constructively. Second, the sum of gain and loss around the loop must equal or exceed unity. During start-up the loop gain is greater than one and the oscillation amplitude grows exponentially until, ultimately, the amplifier is driven into gain compression, thereby stabilizing the oscillator at unity loop gain. Active device saturation may be used to limit gain but an automatic gain control (AGC) circuit or clipping diodes may be used instead in precision oscillator applications.

In a dual-mode oscillator the Barkhausen criteria are met simultaneously for both resonant modes, the resonator oscillating at both frequencies. The oscillator may include one amplifier serving both feedback frequencies, or, alternatively, two separate amplifiers, one for each resonant mode.

Dual Mode Temperature Sensing, Direct Resonator Heating

Figure 7:
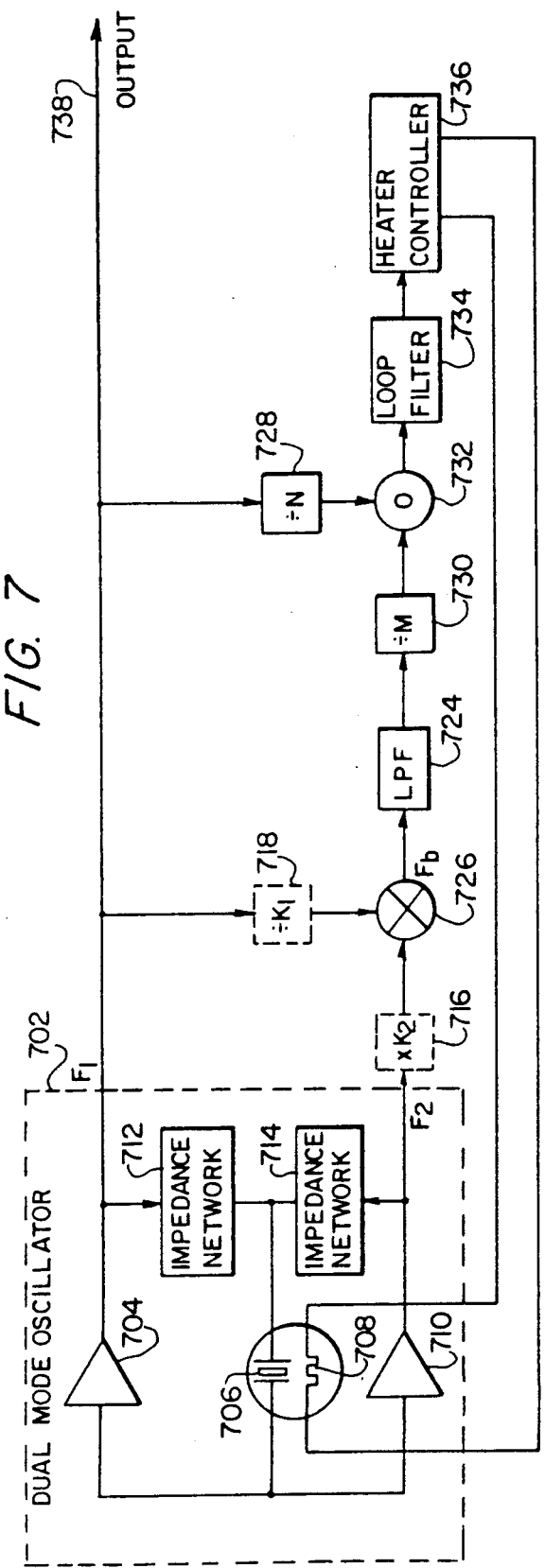
FIG. 7 is a block diagram of a preferred dual mode temperature sensing oscillator with direct resonator heating.

FIG. 7 illustrates a crystal oscillator with direct resonator heating and dual mode temperature sensing dual mode according to a preferred embodiment of the present invention. The FIG. 7 embodiment uses a typical dual-mode oscillator 702, with the understanding that other implementations of dual mode oscillators are possible. A crystal resonator 706 with a heating element 708 preferably disposed directly thereon are illustrated with amplifiers 704, 710 and respective impedance networks 712, 714. The output of amplifier 704 provides an essentially temperature-invariant signal $F_1$ which is used as the output 738 of the oscillator. The output of amplifier 710 provides a signal $F_2$ which varies significantly with temperature, and is used in a feedback loop for controlling heating element 708.

The resonator 706 may be chosen to be an FC-cut, AT-cut, SC-cut or other suitable resonator, as described above. In the FIG. 7 embodiment, the resonator must be capable of maintaining two modes, for generating the $F_1$ and $F_2$ signals. Heating element 708 is preferably deposited directly on the resonator surface, as shown in the embodiments of FIG. 1. Other oscillator components may be implemented as follows.

In the illustrated embodiment, two amplifiers 704, 706 are used within the dual mode oscillator, one amplifier for maintaining each mode. The crystal resonator 706 is included in a feedback path common to both amplifiers. First and second impedance networks 712 and 714 connect the outputs of respective amplifiers 704, 710 to the resonator. The impedance networks perform two functions.

First, these networks isolate the amplifiers 704, 710 from each other. The first network 712 presents a low series impedance at the $F_1$ mode frequency, and a high impedance at the $F_2$ mode frequency. The second impedance network 714 has a complementary impedance function, with low impedance at $F_2$ and high impedance at $F_1$. Thus, in the illustrated embodiment, each amplifier supports oscillation of just one mode.

Second, the impedance networks fulfill the phase requirement of the Barkhausen criteria for maintaining oscillation in the two modes. In some embodiments, the impedance networks also impedance-match the amplifier outputs and the resonator.

As discussed above, the dual mode oscillator has two outputs. One is largely stable with temperature and is referred to herein as $F_1$. The second output varies with resonator temperature and is labelled $F_2$.

In the illustrated embodiment, frequency $F_2$ is multiplied by a factor $k_2$ at a frequency multiplier 716. Other implementations are possible in which the frequency multiplier 716 is not used, or is replaced by frequency division. Similarly, element 718 (shown in FIG. 7 as a frequency divider) may also be implemented as a frequency multiplier, or it may be omitted altogether. Thus, frequency multiplication or division of one or both signals is envisioned. Both multiplier 716 and divider 718 are shown in dotted lines to indicate their optional inclusion.

The multiplied signal $k_2 F_2$ from multiplier 716 and the divided signal $F_1/k_1$ from divider 718 are input to a mixer 726. Mixer 726 generates a beat signal $F_b$ having a frequency equal to the frequency difference between $F_1/k_1$ and the multiplied $k_2 F_2$. Mathematically, frequency $F_b$ is given by:

$$F_b = F_1/k_1 \pm k_2 \cdot F_2$$

where it is understood that either or both of $k_1$ and $k_2$ may be set equal to one if divider 718 and multiplier 716 are omitted from the design. In this arrangement, the beat note frequency $F_b$ provides an indication of resonator temperature.

A low-pass filter 724 separates the desired difference component $F_b$ while suppressing unwanted higher frequency components generated by mixer 726. In some embodiments, mixing can occur as a desirable side effect of nonlinearity in the dual mode oscillator. Otherwise, the mixer is a component or group of components assembled for the purpose of developing a beat signal from signals $F_1/k_1$ and $k_2 F_2$.

Briefly, because beat frequency $F_b$ is a highly responsive and accurate indication of present resonator temperature, a servo system is provided at the output of low-pass filter 724 that maintains a constant, temperature-indicative frequency $F_b$ by application of an appropriate function of electrical current to resonator heating element 708. The servo loop includes a phase detection function 728, 730, 732, a loop filter 734, and a heater controller 736. Control of resonator heating is thus achieved through duty cycle modulation. This duty cycle modulation directly controls and precisely regulates the resonator temperature and, by implication, the output frequency $F_1$ and beat frequency $F_b$.

The servo mechanism indicated in FIG. 7 is a simple phase lock loop including divide-by-M circuit 730 and divide-by-N circuit 728, a phase detector 732, and a loop filter 734 which drives heater controller 736. Frequency dividers 728 and 730 respectively receive the $F_1$ and filtered $F_b$ signals, and provide outputs to phase detector 732. The dividers may be digital devices that generate one output pulse for a given integer number of input pulses. The ratio of M to N determines the regulated resonator temperature.

Preferably, the phase detection function shown as elements 728, 730, 732 may be implemented as a frequency-phase detector. A frequency-phase detector has the advantage of providing an error reducing output when the loop is out of lock, thus aiding initial lock acquisition. Preferred embodiments of the phase detection function employ digital implementations of the phase-frequency detector. One particularly advantageous implementation of the phase lock loop employs one of a number of commercially available integrated circuits originally intended for frequency synthesis applications. These commercially available devices contain a digital phase-frequency detector as mentioned above, along with programmable dividers fulfilling the functions of dividers 728 and 730. Examples include the MOTOROLA MC145151-1 and MC145152-1. The latter contain circuitry needed to control an external dual modulus divider, a desirable feature when the oscillator $F_1$ output is high in frequency. The manufacturer's data sheets and application notes for both devices (*MOTOROLA CMOS/NMOS SPECIAL FUNCTIONS DATA*, 1986, pages 6-63 through 6-83, from MOTOROLA Inc., P.O. Box 6000, Austin, Tex. 78762) are incorporated by reference herein. An embodiment using one of these chips is illustrated in FIG. 8; like element numbers refer to like elements in FIG. 7. Alternative embodiments of the phase detection function include analog voltage or current multiplication, mixing as in a double balanced mixer, and digital implementations such as an exclusive OR gate. Software phase or frequency lock implementations also lie within the contemplation of the invention.

Referring again to FIG. 7, the loop filter 734 rejects unwanted phase detector output components. Loop filter 734 also integrates the error signal as a function of time, thus reducing the static frequency error at the phase detector to zero in accordance with standard servo theory. An operational amplifier integrator or an RC integrator may satisfactorily fulfill the loop filter function. The loop filter design follows standard practice, and is readily capable of implementation by those skilled in the art.

Heater controller 736 may efficiently implement heater current control using a pulse duration modulator as described in the previous embodiments (FIGS. 3 and 5). It is recognized that alternative implementations of the heater control function include any modulation scheme in which the duty cycle of the current waveform to the heating element 708 is properly modulated. Such modulation schemes include pulse frequency modulation using pulses of constant width, software-controlled duty cycle modulation, or any combination of modulation schemes achieving efficient or desirable control of the heating function.

Software-based or firmware-based implementations of pulse modulation functions accept a series of digital words representing the output of the temperature sensing mechanism. The digital words may be formed from the analog temperature feedback signals using a standard analog-to-digital converter. A logarithm function or look-up table linearizes the input as needed.

A preferred software implementation of pulse modulation is one which implements a pulse width modulation function using a software counter value which is continuously incremented in a loop. The counter value increments with each loop iteration, and is compared to the input word representing the present temperature. The comparison result provides a binary output to the heater current element, being in a first binary state when the counter value is less than the input word, and in a second binary state when the counter is greater than or equal to the input word. The selection of the binary state corresponding to a heater current "on" condition is determined by the sense of the temperature sensor output.

In this manner, resonator heater current is periodically turned on for one binary state and off for the other state, thus establishing the pulse width modulation function in software.

Pulse frequency modulation (PFM) may be similarly achieved, either through a hardware implementation or a software implementation. A preferred software PFM implementation involves a loop similar to that described above. However, an output of a constant-width binary current pulse is generated when the incrementing counter value reaches the input value representing the temperature. As the current pulse is provided, the counter is reset to zero. In this manner, as temperature varies from ideal, the changing input temperature value changes the frequency with which the incremented counter value equals it. Thus, the pulse frequency is changed in response to changing sensed temperature.

Hybrid Temperature Control System

Figure 8A:
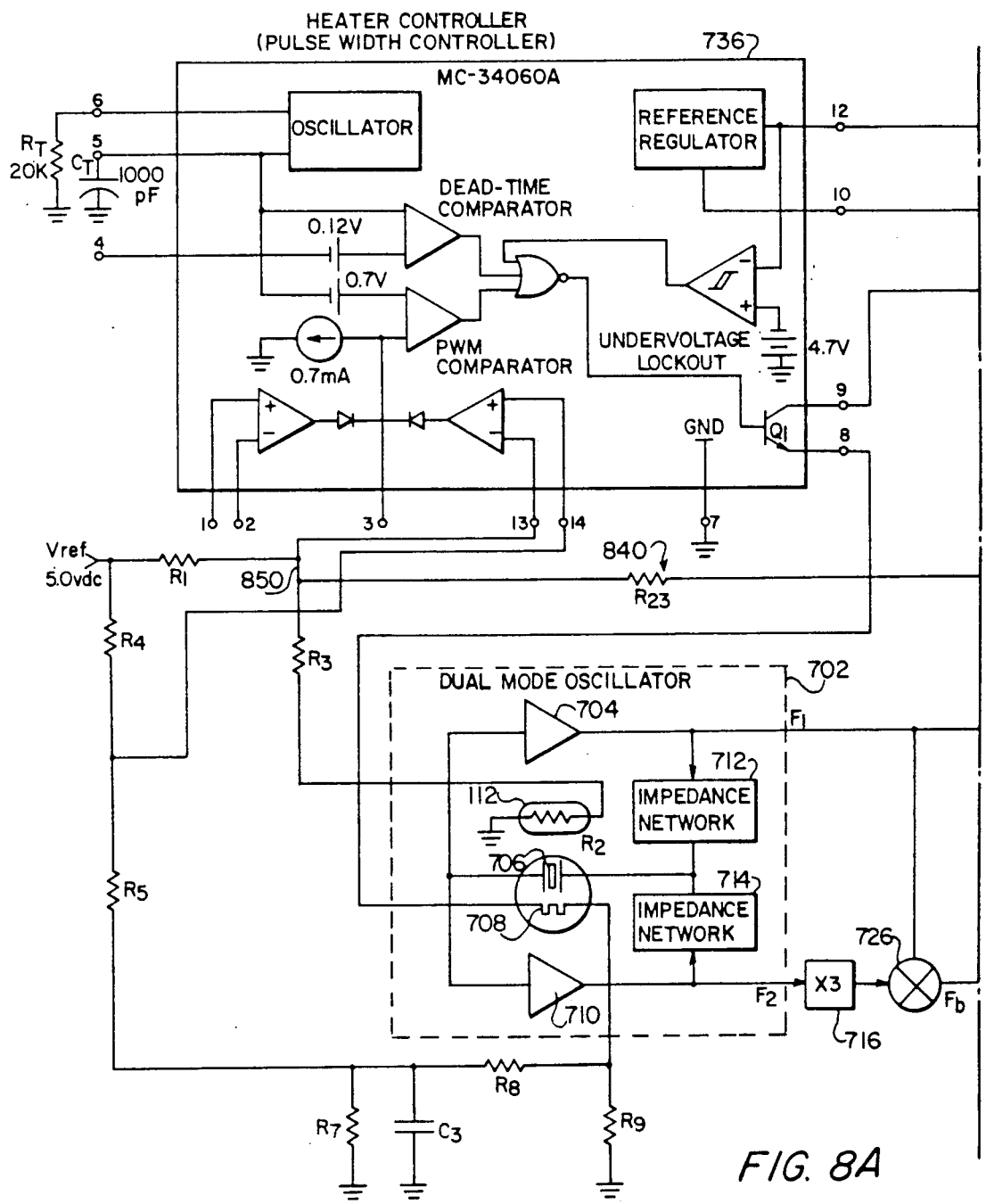
FIGS. 8A and 8B illustrate a particular embodiment of the oscillator of FIG. 7 showing particular implementations of the phase detection function and pulse width heater controller, the embodiment being a hybrid embodiment incorporating teachings from FIGS. 3 and 5 (in which the temperature of the resonator enclosure is sensed) and from FIG. 7 (involving dual mode temperature sensing).
Figure 8B:
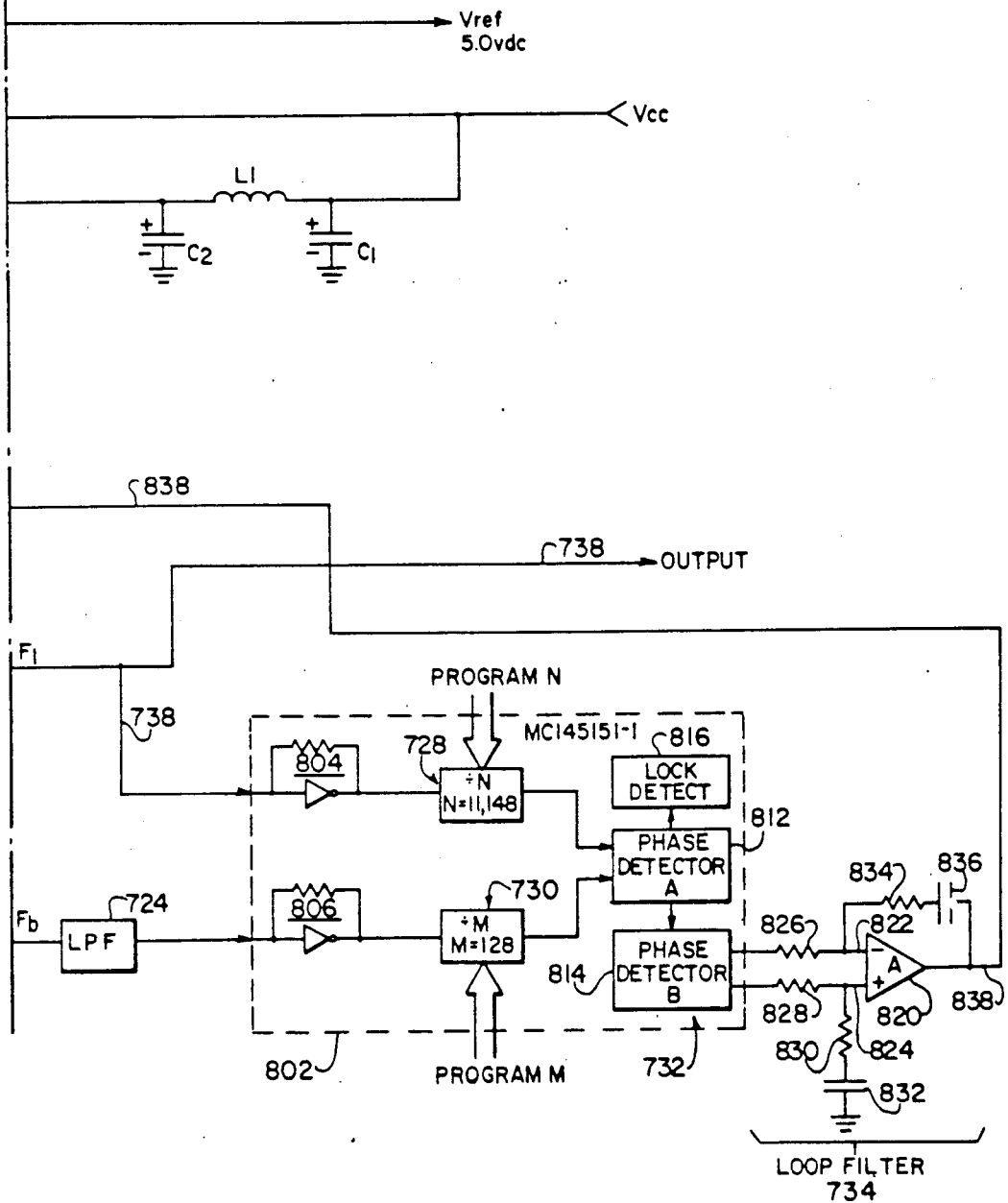

FIGS. 8A and 8B (collectively referred to hereinafter as FIG. 8) illustrate a preferred embodiment of a hybrid oscillator. The oscillator of FIG. 8 may be considered hybrid because it incorporates teachings from both the FIG. 3 embodiment and the FIG. 7 embodiment.

First, a teaching appropriated from the embodiment of FIG. 3 is the use of a pulse duration modulator 306 for controlling the duty cycle of current driving heating element 708. Pulse duration modulator 306 is shown in an even more particular embodiment in FIG. 5, in which a particular integrated circuit chip, the MOTOROLA MC-34060A, is employed. In the FIG. 8 embodiment, this chip comprises a portion of heater controller (here, a current pulse width controller) 736. The oscillator 702 shown in FIG. 8 further comprises a temperature sensing element 102 ($R_2$). The temperature sensing element 112 is preferably a thermistor disposed on the crystal resonator enclosure in the manner illustrated in FIG. 1. Thermistor 112 is connected to pin 13 of the pulse width controller 736 via a series resister $R_3$, the opposite end of the thermistor 112 being connected to ground.

Second, a teaching incorporated from the FIG. 7 embodiment is the use of a dual mode oscillator 702 in a dual mode temperature sensing scheme.

FIG. 8 also illustrates particular implementations of the divide-by-N and divide-by-M circuits 728, 730, and phase detector 732.

Referring to FIG. 8A, it is seen that divide-by-$k_1$ element 718 (FIG. 7) has been purposely omitted. In this manner, $k_1 = 1$ and the first dual mode oscillator output $F_1$ is fed directly into mixer 726. Multiply-by-$k_2$ element 716 (FIG. 7) is embodied by a multiply-by-3 circuit 716, and multiplies the frequency of the second dual mode oscillator output $F_2$ by 3. In this manner, the beat frequency is determined:

$$F_b = F_1 \pm (3 \cdot F_2)$$

Referring more specifically to FIG. 8B, the beat frequency signal $F_b$ is input into a low-pass filter 724 in the same manner as FIG. 7.

In FIG. 8B, divider circuits 728, 730 and phase detector 732 (FIG. 7) are shown in an implementation using the commercially available MOTOROLA MC145151-1 integrated circuit chip 802. Chip 802 includes two circuits 804, 806. Each circuit 804, 806 includes parallel-connected inverters and feedback resistors which amplify and conditions respective signals $F_1$ and the filtered beat frequency signal $F_b$. As known to those skilled in the art upon a review of specification sheets of the MC145151-1 chip, circuit 806 converts the substantially sinusoidal filtered beat frequency from low pass filter 724 into a digital signal. Circuit 804 performs the same function on oscillator output signal $F_1$ (path 738).

In the illustrated embodiment, the divide-by-N circuit 728 divides the output signal $F_1$ by 11,148. The divide-by-M circuit 730 divides the filtered beat frequency signal $F_b$ by 128. The manner in which divider circuits 728, 730 are programmed lies well within the ability of those skilled in the art upon review of data sheets provided for the MC145151-1 chip. The particular values M and N are determined as described below, with reference to FIGS. 9A and 9B.

Integrated circuit chip 802 further performs a phase detection function, which, in the case of the MC-145151-1, may be provided by one or both of two phase detectors. Phase detector 812 has a single output for driving a passive RC loop filter. Phase detector 814 has a differential output suitable for driving a differential amplifier 820 within an active loop filter 734, described below. Further, lock detection circuitry 816 is also present in the MC145151-1 chip, although it need not be used in the present embodiment.

Phase detector 812 receives the divided output frequency signal $F_1/11,148$ and the divided beat frequency signal $F_b/128$. Phase detector 812 is sensed by lock detection circuitry 816 in a manner described in publicly available documentation provided by the manufacturer of chip 802. Similarly, phase detector 814 works in conjunction with phase detector 812 to provide an overall phase detection function generally illustrated as 732 (FIGS. 7 and 8B).

The output of phase detector 732 is provided to loop filter 734. In the FIG. 8B embodiment, loop filter 734 includes an operational amplifier 820 having inverting and non-inverting inputs 822, 824. Respective resistors 826, 828 are connected between phase detector 732 and the inverting and non-inverting inputs 822, 824. A resistor 830 and a capacitor 832 are connected in series between non-inverting input 824 and ground. In the feedback path between amplifier output 838 and the inverting input 822 are a series resistor 834 and a capacitor 836.

The output 838 of amplifier 820 feeds a resistor 840 (R23) which is connected to a node 850 between $R_3$ and the inverting input (pin 13) of PWM comparator in pulse width controller 736. The design of circuit elements within loop filter 734, and choice of the value of feedback resistor 840 ($R_{23}$), are based on loop gain considerations in servo control theory, and thus lie within the ability of those skilled in the art.

The circuit of FIGS. 8A and 8B is a particular preferred embodiment. Integrated circuit chip 802 illustrates one particular implementation of functions to be performed, as it efficiently provides the desired functions shown in FIG. 7. However, other embodiments lie within the contemplation of the invention. For example, a single phase detector may be used in place of phase detectors 812, 814. In the MC145151-1 chip, it is known that the two phase detectors provide different out-of-lock performance and different gain factors; however, variations from the particular embodiment shown in FIG. 8B may be made by those skilled in the art without varying from the spirit of the invention. Similarly, heater controller 736 may be employed in any manner consistent with controlling the heater 708 to maintain the temperature of the resonator at a desired temperature. Preferably, heater control is achieved through modulation of the duty cycle of current passing through the heater, such as through pulse width modulation (as illustrated), pulse frequency modulation, or through software or firmware control. However, it is understood that variations on and improvements of particular elements may be made to particular elements while still remaining within the scope of the present invention as a whole, as expressed in the claims which follow this specification.

The operation of the circuit in FIGS. 8A and 8B is now described.

Generally, the temperature of resonator 706 is maintained through controlled application of current pulses through heating element 708. Control of the power supplied to the heating element is preferably performed in a substantially binary fashion, having on and off periods of current flow defined by a duty cycle (in pulse width modulation, as illustrated in FIG. 8A). Alternatively, power provided to the heating element may also be defined by a pulse frequency (in pulse frequency modulation of pulses with constant width). Implementations of these and other modulation schemes by software or firmware also lies within the contemplation of the invention.

In the illustrated embodiment, the duration and timing of the heater's current pulses is substantially determined by two feedback paths. In both feedback paths, the quantity being fed back represents a temperature. However, the manner in which temperature is determined differs between the two feedback paths.

The first feedback path may be considered to be a "direct" temperature sensing by thermistor (temperature sensor) 112 ($R_2$). (Here, the term "direct" implies sensing an actual temperature, even though it may be physically separated from the resonator itself by a substantial thermal resistance.) The directly sensed temperature quantity is passed through resistor $R_3$ to the PWM comparator in pulse width controller 736.

The second path may be considered an "indirect" temperature sensing using the dual mode temperature sensing allowed by dual mode oscillator 702. (Here, the term "indirect" implies sensing a temperature through direct measurement of another parameter, temperature, so that "temperature sensing", as such, is derivative.) The phase lock error voltage at the output of amplifier 820 is connected to the PWM comparator in pulse width controller 736 via the feedback resistor 840 ($R_{23}$).

Both feedback paths, through $R_3$ and through $R_{23}$ to a common node 850, may contribute to controlling the width of current pulses passing through heating element 708. However, it is helpful to think of the first path (through $R_3$) as being a coarse adjustment feedback path, with the second path (through $R_{23}$) as being a fine adjustment feedback path.

In a particular preferred embodiment, a method may be practiced in which, upon power-up, the first feedback path (using external "direct" temperature sensing of the crystal enclosure) guides the crystal temperature to within a given range about a desired temperature point. This may be achieved as in the embodiment described above, with respect to FIG. 3. After this coarse temperature adjustment is made, finer adjustments may be made by dual mode temperature sensing function which is performed using elements 716, 726, 724, 802, and 734. Both the coarse and fine tuning feedback paths are preferably active simultaneously, with the fine tuning path being more sensitive to small temperature excursions.

Thus, the present invention provides a method of controlling the temperature of a resonator in a resonator oscillator, the resonator functioning in first and second modes. The method comprises the steps of sensing the temperature of a resonator enclosure, feeding back the sensed temperature to a first heater control circuit, providing a heater control signal to a heater which is disposed in substantially direct thermal contact with the resonator, to bring the resonator to within a first range about a desired temperature. Also, the method provides the steps of sensing the temperature of the resonator by comparing the first and second modes, and continuing to provide heat to the heater based on the temperature sensed by comparison of the first and second modes, to maintain the resonator within a given second range about the desired temperature.

Figure 9A:
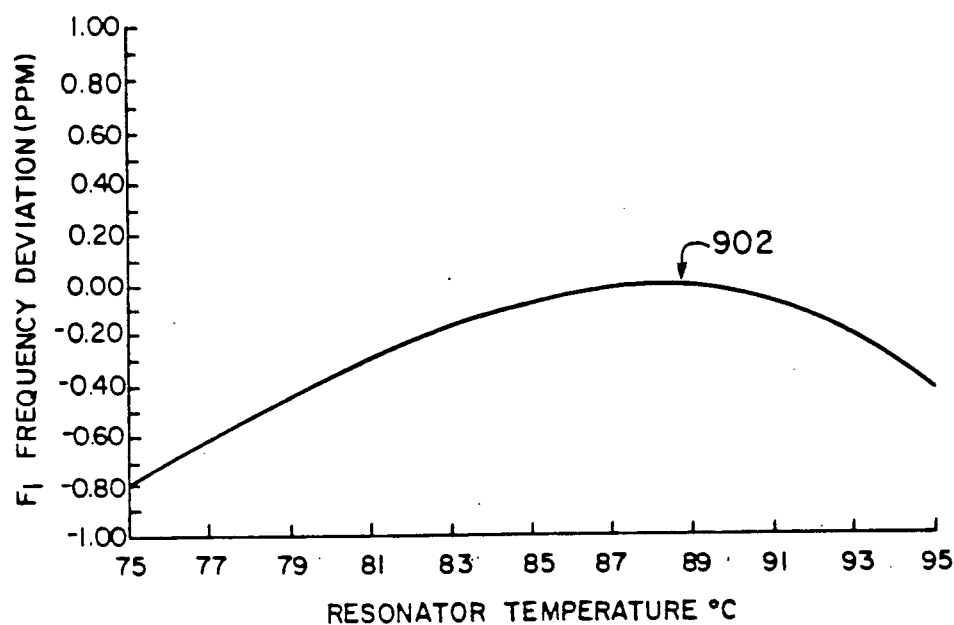
FIG. 9A shows the relationship between oscillator output frequency $F_1$ and FIG. 9B shows the dual mode beat note frequency $F_b$, each as a function of resonator temperature for an SC-cut crystal resonator.
Figure 9B:
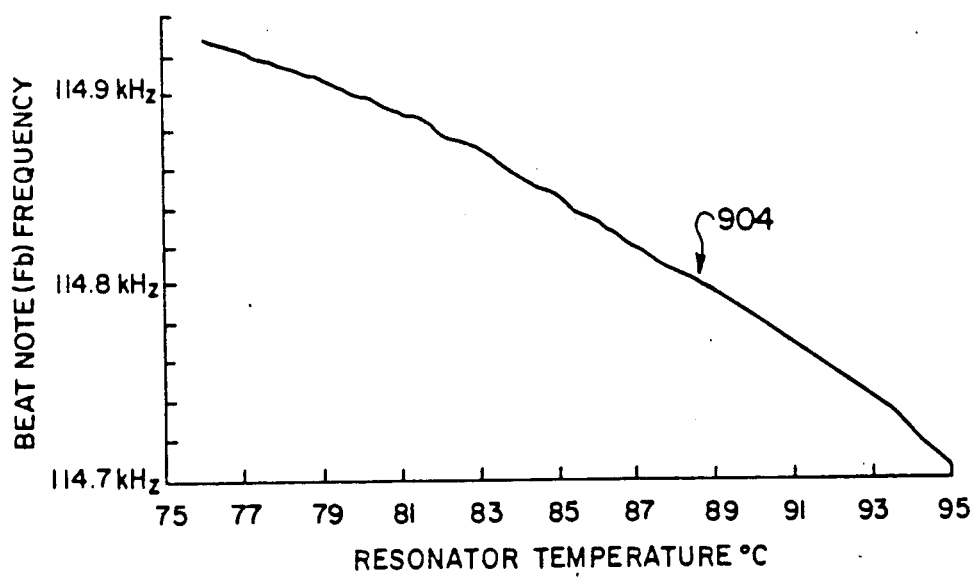

FIGS. 9A and 9B show output frequency $F_1$ and beat frequency $F_b$, each as a function of resonator temperature. The curves are useful in explaining particular values used in FIGS. 8A and 8B when a 10 MHz output signal $F_1$ is desired. These curves illustrate performance of an SC-cut crystal when used as the resonator 706 in FIG. 7 or FIG. 8. Resonator temperature sensitivity for this particular resonator cut is minimum at approximately 88° C., where the slope of the frequency-temperature curve equals zero. The point of minimum temperature sensitivity is indicated in FIG. 9A as 902. Generally, temperature regulation schemes achieve optimum performance by maintaining the resonator temperature as close as possible to this point 902 of zero slope.

FIG. 9B shows the frequency difference between the third overtone response at 10 MHz of an SC-cut resonator and a third harmonic of the fundamental mode response. The difference frequency corresponds to the beat note frequency Fb provided in mixer 726 (FIGS. 7, 8A). The beat note frequency at the zero slope temperature (904 in FIG. 9B) is approximately 114.816 kHz. Division by 128 performed by element 730 (FIG. 8) yields a phase detector input signal of 897 Hz. Dividing output signal $F_1$ (here, 10 MHz) by 11,148 in divider 728 produces a second phase detector input signal at 897 Hz. Both signals enter phase detector element generally indicated as 732.

As introduced above, deviation of the resonator temperature away from the 88° C. ideal temperature causes a change in the beat note frequency which is detected by the phase detector 732. The phase detector responsively supplies a corrective signal to the pulse width modulator in heater controller 736, thereby changing the resonator heater current to restore the resonator to its ideal temperature. In this manner, excellent resonator temperature stability is achieved.

As is known to those skilled in the art, the resonator turn point 902 (the point of zero frequency temperature slope) varies from resonator to resonator as a result of manufacturing variations. According to the present invention, such variation is easily accommodated by changing the divisor M in dividing element 730.

Output Phase Lock Loop

Figure 10:
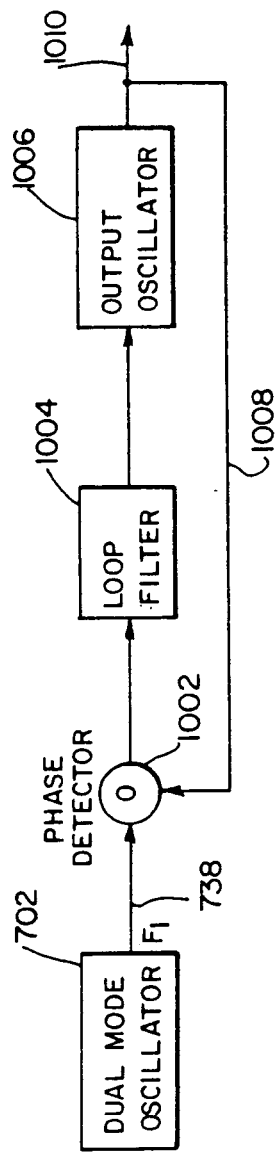
FIG. 10 illustrates in block diagram form a dual mode oscillator followed by a second phase locked oscillator which removes unwanted residual spurious signal arising from the temperature sensing mode.

FIG. 10 illustrates the dual mode oscillator 702 (such as that in FIGS. 7 or 8A) connected to an output phase lock loop (PLL). Because it is not possible for impedance network 712 (FIGS. 7 and 8A) to provide total rejection of the temperature sensing mode signal $F_2$, the dual mode oscillator output $F_1$ contains some spurious energy at the $F_2$ frequency. This frequency contamination is unacceptable in many applications. The FIG. 10 PLL receives the contamined frequency signal $F_1$ on path 738, providing a clean output signal which is free of this $F_2$ contamination.

As illustrated in FIG. 10, a second oscillator 1006 is phase-locked to the output $F_1$ of dual mode oscillator 702. In particular, a phase detector 1002 receives both the output frequency signal $F_1$ on path 738 and the final output signal from the output oscillator 1006 along a feedback path 1008. The phase detector 1002 provides an error signal to a loop filter 1004. The filtered error signal is input to the output oscillator 1006 which provides the ultimate output 1010. The output 1010 is free of contamination from temperature mode sensing signal $F_2$.

For the second oscillator 1006 to remain locked over the full range of ambient temperature, it may either be designed to have sufficient electronic frequency range to accommodate its full frequency temperature excursions, or it may be directly heated in the same manner as the dual mode resonator 706 itself (FIGS. 7 and 8). The approach of using electronic frequency adjustment degrades phase noise, so that is generally less desirable than the second approach.

The second approach (of heating the crystal directly) might generally be thought to require additional heating energy. However, according to a further aspect of the present invention, the two resonators may be packaged in a common enclosure. Such a common enclosure is illustrated in FIG. 11.

Plural Resonators in Common Enclosure

Figure 11:
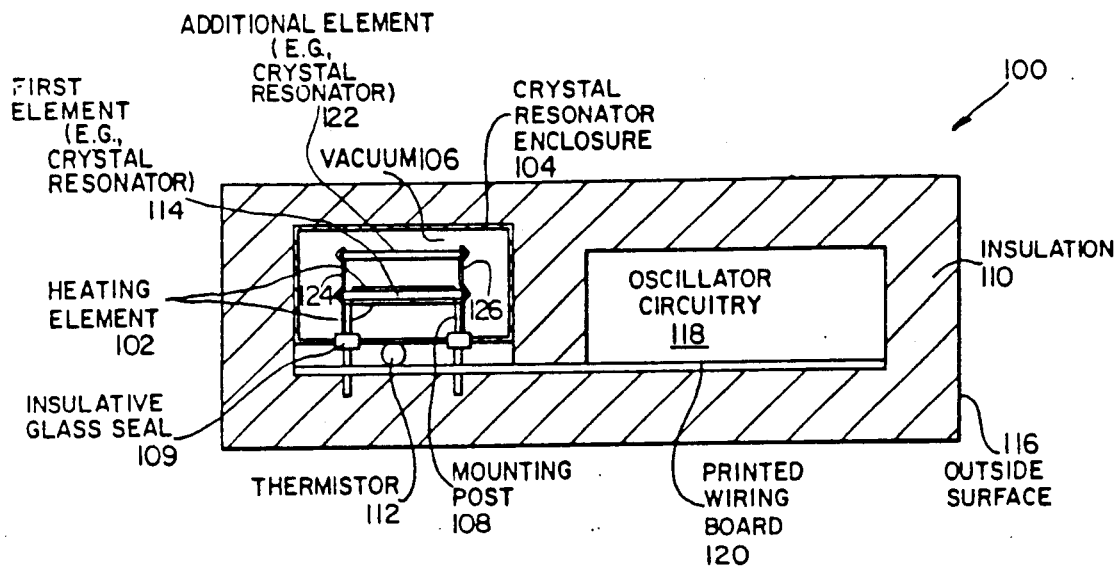
FIG. 11 illustrates a further embodiment of the invention in which two elements (at least the second of which is a resonator) are present in the same enclosure, a first element (such as the resonator in the dual mode temperature sensing oscillator of FIG. 10) being directly heated and the second resonator (such as one in the phase-locked output oscillator of FIG. 10) being indirectly heated through thermal contact with the first.

FIG. 11 shows two disk-shaped elements 114, 122 are situated within a common evacuated enclosure 104. In a first embodiment, both elements 114, 122 are resonators. In other embodiments, the lower element 114 may be a non-resonant structure. It may comprise quartz, glass or ceramic, depending on the application and desired characteristics.

In the first embodiment, and additional crystal resonator 122 is shown in conjunction with circuit elements which were described above, with reference to FIG. 1A. In the illustrated embodiment, the second resonator 122 is heated by conduction through mounting leads 124, 126. The first element 114 is assumed to be a resonator disposed substantially in series between the enclosure 104 and the second resonator 122. Thus, assuming the enclosure to contain a vacuum in its interior, the only thermal path to and from the second resonator 122 is through the first resonator 114 and its associated mounting structures. The second resonator is at least as thermally isolated as the first resonator. Therefore, negligible additional heating power is required for maintaining the second resonator's temperature, especially after a steady-state temperature is achieved by the resonators. Also, the first resonator 114 experiences non-ideal temperature variations sooner than the second resonator 122, so dynamic temperature control is more responsive.

The lower crystal 114 functions in conjunction with the dual mode oscillator shown in FIG. 8. In this embodiment, the first and second mode signals $F_1$ and $F_2$ of the first resonator 114 enable dual mode temperature sensing. Direct resonator heating may be accomplished through feedback of the sensed temperature, as described with reference to FIG. 8. Heat conduction through mounting leads 124, 126 maintain the temperature of the upper resonator 122.

Use of plural resonators within the same crystal resonator enclosure 104 allows a variety of oscillator configurations.

For example, the upper resonator 122 may be a part of output oscillator 1006 (FIG. 10), the phase locked oscillator which removes spurious components from the output of the dual mode oscillator 702. The lower resonator 114 is part of the dual mode oscillator 702. Heat directly applied to the lower (dual-mode temperature sensing) resonator provides temperature regulation of both resonators.

In another configuration, the upper resonator 122 can be made electrically independent of the lower resonator 114. In this configuration, the lower resonator 114 serves as a part of a dual mode oscillator for maintaining temperature regulation for both resonators as in the configuration of the previous paragraph. However, the upper resonator is part of a second oscillator which is completely independent of the first resonator, and is not phase-locked to the lower (dual-mode) resonator.

Finally, the lower element 114 can be embodied by a non-resonant, electrically non-conductive element of the same size and shape as a resonator. This element has the heating element 102 deposited directly on its surface, along with a temperature sensor (not illustrated in FIG. 11). Both elements 114, 122 are electrically connected to mounting posts making them accessible outside he resonator enclosure. This arrangement is heated in a manner in accordance with FIG. 3. The temperature of the upper element 122 is maintained without direct application of heat to its surface. This arrangement advantageously avoids mechanical stress associated with thermal gradients on resonators which are not stress-compensated.

Insulative Support Structure

A still further aspect of the present invention is now discussed.

Figure 12A:
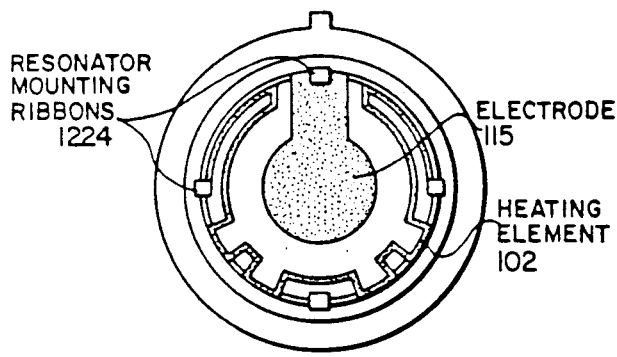
FIGS. 12A, 12B, and 12C illustrate an embodiment in which an insulative support structure provides thermal isolation to a resonator.
Figure 12C:
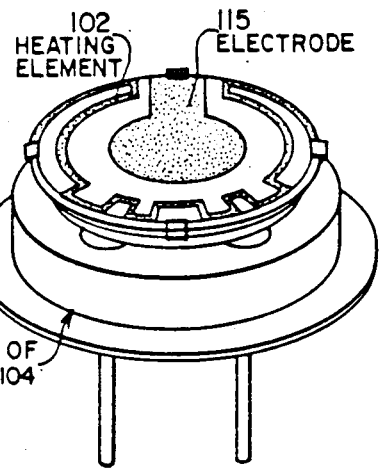
Figure 12B:
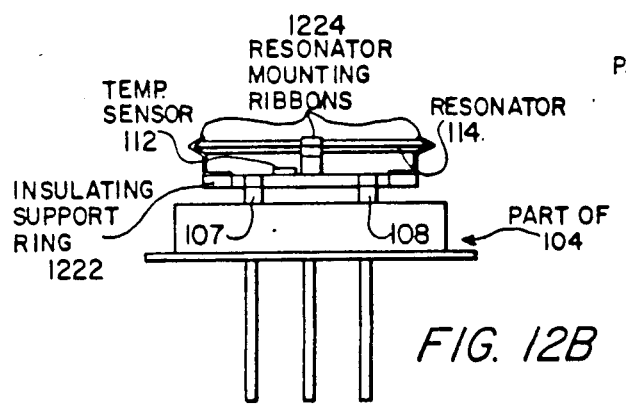
Figures 13A, 13B:
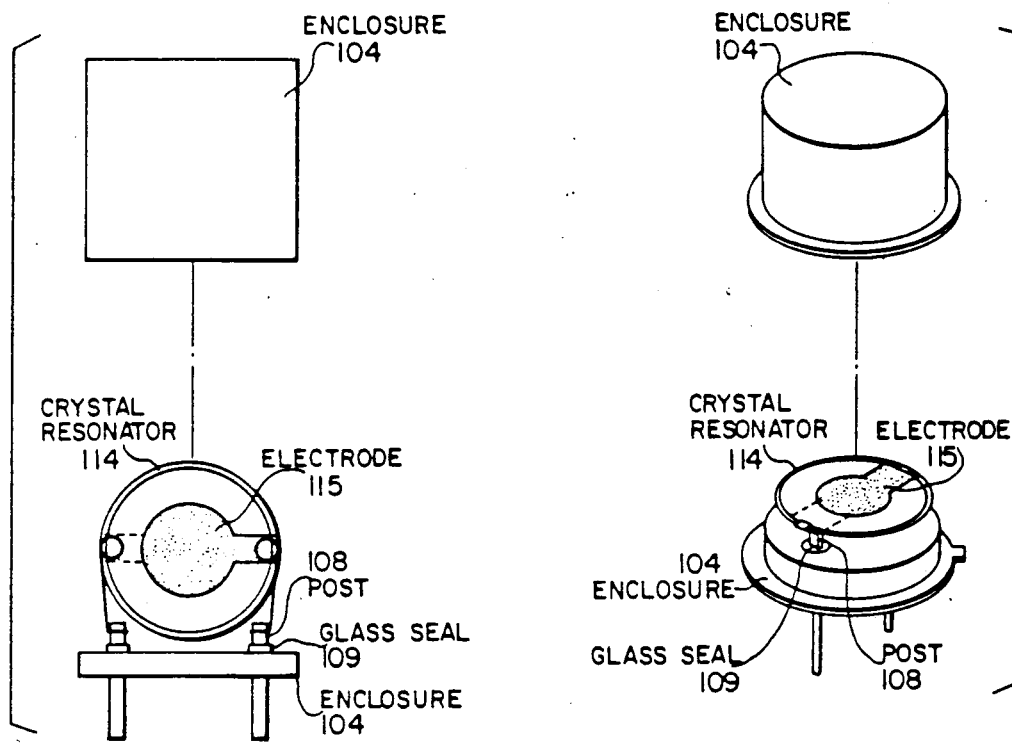
FIGS. 13A and 13B illustrate structures of conventional crystal oscillators an enclosures, without heating elements.

Generally, power consumption may be reduced by increasing thermal resistance between a resonator and its enclosure. Specifically, the thermal path between the resonator and its enclosure may be increased by additional of an insulative support structure such as ring 1222 (FIGS. 12A, 12B, and 12C, which may collectively be referred to herein as FIG. 12). In FIG. 12, like element reference numerals correspond to like elements in FIGS. 1A, 1B, and 1C. However, mounting posts 107 and 108 were previously connected directly to heating element 102 and to the electrode 115, respectively. In contrast, in the embodiment of FIG. 12, the mounting posts instead extend between the base of the resonator enclosure 104 to the insulative support ring 1222. Extending upward from the insulative support ring 1222 are four mounting ribbons 1224 which support the quartz crystal resonator 114.

In FIG. 12, heating element 102 may optionally be deposited on only one side of the resonator 114, for simplicity of manufacture. As illustrated, it is shaped to evenly distribute heat across the face of the resonator.

Preferably, resonator mounting ribbons 1224 attach to the insulative support ring 1222 midway between adjacent mounting posts 107, 108, this maximum separation along the ring providing maximum thermal resistance. Thin film conductors deposited on the surface of the insulative support ring maintain electrical continuity between the mounting posts 107, 108 and the resonator support ribbons 1224 without substantially compromising the thermal insulative properties of the support ring 1222.

Preferably, the insulative support ring 1222 may be made of glass or fused quartz. However, any thermally insulative material capable of accepting surface metallic thin films is an acceptable material. Choice of particular support structures lies within the ability of those skilled in the art.

In a still further refinement of the present invention, the temperature sensor 112 is mounted on the surface of the insulative support ring 1222, preferably adjacent one of the resonator mounting ribbons 1224. In this arrangement, the temperature of the temperature sensor closely tracks that of the resonator. Further, the previously described beneficial effects of thermal feedback are increased by the presence of the insulative support ring 1222, mounting posts 107, 108, insulative glass seal 109 (FIG. 1B), in addition to the thermal resistance of any external insulation 110 (FIG. 1A).

In summary of the advantages of FIG. 12, the addition of insulative support ring 1222 reduces power consumption. Further, placing a temperature sensor 112 on the insulative support ring improves resonator temperature regulation, as the increased thermal resistance accentuates the advantages of the thermal feedback configuration without the necessity of adding more external insulation.

Conclusion

It is apparent that many modifications and variations of the above-described embodiments of the present invention are possible in light of the above teachings. It is therefore to be understood that, within the scope of the appended claims and their equivalents, the invention may be practiced otherwise than as specifically described.

What is claimed is:

1. A temperature-controlled resonator oscillator, comprising:
    a resonator;
    a heating element in substantially direct thermal contact with the resonator, for applying heat to the resonator;
    a heat-sensing device, separated from the resonator by a substantial thermal resistance, for indirectly sensing the temperature of the resonator; and
    a heater control circuit receiving the sensed temperature and generating a heater control signal for determining the manner in which heat is applied to the resonator by the heating element;
    wherein the control circuit provides dynamic control of the resonator's resonant frequency through feedback of the sensed temperature.

2. The oscillator of claim 1, wherein the heater control circuit comprises a switching mode integrated circuit.

3. The oscillator of claim 1, wherein:
    the heater control circuit provides energy to the heating element in a substantially digital waveform, including periods when substantially no energy is provided and other periods when a predetermined amount of energy is provided.

4. The oscillator of claim 3, wherein:
    the heater control circuit includes a pulse width modulator substantially controlling energy supplied to the heating element by controlling a duty cycle of an electrical current signal applied to heating element.

5. A temperature-controlled resonator oscillator, comprising:
    an SC-cut resonator;
    a heating element in substantially direct thermal contact with the SC-cut resonator, for applying heat to the SC-cut resonator;
    a heat-sensing device, separated from the SC-cut resonator by a substantial thermal resistance, for indirectly sensing the temperature of the resonator; and a heater control circuit receiving the sensed temperature and generating a heater control signal for determining the manner in which heat is applied to the SC-cut resonator by the heating element;
wherein the heater control circuit provides dynamic control of the SC-cut resonator's resonant frequency through feedback of the sensed temperature in a substantially closed-loop manner.

6. The oscillator of claim 5, further comprising:
an insulative layer at least partially surrounding the resonator enclosure, so as to increase the thermal resistance between the resonator enclosure and an ambient environment.

7. The oscillator of claim 5, wherein the heater control circuit comprises a switching mode integrated circuit.

8. The oscillator of claim 5, wherein:
the heater control circuit provides energy to the heating element in a substantially digital waveform, including periods when substantially no energy is provided and other periods when a predetermined amount of energy is provided.

9. The oscillator of claim 8, wherein:
the heater control circuit includes a pulse width modulator substantially controlling energy supplied to the heating element by controlling a duty cycle of an electrical current signal applied to heating element.

10. A temperature-controlled resonator oscillator, comprising:
a resonator functioning in two modes,
1) the first mode producing a first signal at a first frequency, and
2) the second mode producing a second signal at a second frequency which may be distinct from the first frequency;
a heating element in a substantially direct thermal contact with the resonator, for applying heat to the resonator;
a feedback circuit, receiving the first and second signals for generating a temperature feedback signal substantially indicative of the temperature of the resonator; and
a heater controller circuit, responsive to the temperature feedback signal, for controlling the manner in which the heating element applies heat to the resonator.

11. The oscillator of claim 10, wherein:
the heater control circuit provides energy to the heating element in a substantially digital manner, including periods when substantially no energy is provided and other periods when a predetermined amount of energy is provided.

12. The oscillator of claim 11, wherein:
the heater control circuit includes a pulse width modulator substantially controlling energy supplied to the heating element by controlling a duty cycle of an electrical current signal applied to the heating element.

13. A resonator oscillator for producing an output signal having an output frequency, comprising:
a resonator enclosure;
a first element within the enclosure;
a heating element in substantially direct thermal contact with the first element, for applying heat to the first element;
a second element within the enclosure, consisting essentially of a resonator for producing a signal of a frequency related to the output frequency of the resonator oscillator;
means for sensing the temperature of the first element; and
means, responsive to the means for sensing, for controlling the heating element.

14. The oscillator of claim 13, wherein:
the first element is disposed substantially in series between the resonator enclosure and the second element, providing greater thermal isolation to the second element.

15. The oscillator of claim 14, wherein:
the first element consists essentially of a resonator.

16. A resonator oscillator for producing an output signal having an output frequency, comprising:
a resonator enclosure;
a first element within the enclosure;
a heating element in substantially direct thermal contact with the first element, for applying heat to the first element;
a second element consisting essentially of a resonator within the enclosure for producing a signal of a frequency related to the output frequency of the resonator oscillator;
a heat-sensing device, separated from the first element by a substantial thermal resistance, for indirectly sensing the temperature of the element; and
a heater control circuit receiving the sensed temperature, for generating a heater control signal for determining the manner in which heat is applied to the first element by the heating element.

17. The oscillator of claim 16, wherein:
the first element is disposed substantially in series between the enclosure and the second element, providing greater thermal isolation to the second element.

18. The oscillator of claim 17, wherein:
the first element consists essentially of a resonator.

19. A resonator oscillator for producing an output signal having an output frequency, comprising:
a resonator enclosure;
a first resonator within the enclosure, functioning in first and second modes;
a heating element in substantially direct thermal contact with the first resonator, for applying heat to the first resonator;
a second resonator within the enclosure for producing a signal of a frequency related to the output frequency of the resonator oscillator;
a temperature feedback control circuit, responsive to the first and second modes of the first resonator, producing a temperature feedback signal; and
a heater controller, responsive to the temperature feedback signal, for determining the manner in which heat is applied to the first resonator by the heating element.

20. The oscillator of claim 19, wherein:
the first resonator is disposed substantially in series between the enclosure and the second resonator, providing greater thermal isolation to the second resonator.

21. A resonator oscillator, comprising:
a first resonator operating in first and second modes;
a heating element in substantially direct thermal contact with the first resonator, for applying heat to the first resonator;
a heater control circuit, responsive to the first and second modes of the first resonator, for generating a heater control signal for determining the manner in which heat is applied to the first resonator by the heating element; and a second resonator, comprising a portion of an output oscillator which is phase-locked to the first mode of the first resonator, the second resonator providing a signal at an output frequency which is not substantially affected by the second mode of the first resonator.

22. The oscillator of claim 21, wherein:

the first and second resonators are enclosed within a common resonator enclosure.

23. The oscillator of claim 22, wherein:

the first resonator is disposed substantially in series between the enclosure and the second resonator, providing greater thermal isolation to the second resonator.

24. A resonator oscillator, comprising:

a resonator enclosure;

a resonator disposed within the resonator enclosure;

an insulative support structure disposed between the resonator and the resonator enclosure and providing thermal resistance between the resonator and the resonator enclosure;

at least one resonator mounting structure extending between the resonator and the insulative support structure; and at least one mounting element extending between the insulative support structure and the enclosure.

25. The oscillator of claim 24, further comprising:

a temperature sensor attached to the insulative support structure.

26. The oscillator of claim 25, wherein:

the temperature sensor is closer to the resonator mounting structure(s) than to the mounting element(s).

27. The resonator oscillator of claim 26, wherein:

the insulative support structure is ring-shaped; and the at least one mounting element includes at least one support post, extending between the insulative support ring and the resonator enclosure from point(s) substantially distant from the resonator mounting structures.

28. The resonator oscillator of claim 24, wherein:

the insulative support structure is ring-shaped; and the at least one mounting element includes at least one support post, extending between the insulative support ring and the resonator enclosure from point(s) substantially distant from the resonator mounting structures.

29. The oscillator of claim 28, further comprising:

a temperature sensor attached to the insulative support structure.

30. A method of controlling the temperature of a resonator in a resonator oscillator, the resonator functioning in first and second modes, comprising the steps of:

sensing the temperature of a resonator enclosure;

feeding back the sensed temperature to a heater control circuit;

providing a heater control signal to a heater which is disposed in substantially direct thermal contact with the resonator, to bring the resonator to within a first range about a desired temperature;

sensing the temperature of the resonator by comparing the first and second modes; and continuing to provide heat to the heater based on the temperature sensed by comparison of the first and second modes, to maintain the resonator within a given second range about the desired temperature.

* * * * *